(12) United States Patent
Weyers

(10) Patent No.: US 10,418,358 B2
(45) Date of Patent: Sep. 17, 2019

(54) SEMICONDUCTOR DEVICE HAVING AN ELECTROSTATIC DISCHARGE PROTECTION STRUCTURE

(71) Applicant: Infineon Technologies Dresden GmbH, Dresden (DE)

(72) Inventor: Joachim Weyers, Hoehenkirchen (DE)

(73) Assignee: Infineon Technologies Dresden GmbH & Co. KG, Dresden (DE)

( * ) Notice: Subject to any disclaimer, the term of this patent is extended or adjusted under 35 U.S.C. 154(b) by 84 days.

(21) Appl. No.: 15/683,811

(22) Filed: Aug. 23, 2017

(65) Prior Publication Data

US 2018/0061823 A1 Mar. 1, 2018

(30) Foreign Application Priority Data

Aug. 25, 2016 (DE) .......................... 10 2016 115 822

(51) Int. Cl.
| | |
|---|---|
| *H01L 27/00* | (2006.01) |
| *H01L 27/02* | (2006.01) |
| *H01L 21/762* | (2006.01) |
| *H01L 27/07* | (2006.01) |
| *H01L 29/06* | (2006.01) |
| *H01L 29/10* | (2006.01) |
| *H01L 29/417* | (2006.01) |
| *H01L 29/45* | (2006.01) |
| *H01L 29/66* | (2006.01) |

(Continued)

(52) U.S. Cl.
CPC ........ *H01L 27/0255* (2013.01); *H01L 21/762* (2013.01); *H01L 27/0292* (2013.01); *H01L 27/0727* (2013.01); *H01L 29/0649* (2013.01); *H01L 29/1095* (2013.01); *H01L 29/16* (2013.01); *H01L 29/41775* (2013.01); *H01L 29/45* (2013.01); *H01L 29/66106* (2013.01); *H01L 29/7802* (2013.01); *H01L 29/7808* (2013.01); *H01L 29/866* (2013.01); *H01L 23/62* (2013.01); *H01L 29/0619* (2013.01); *H01L 29/4238* (2013.01); *H01L 29/7395* (2013.01)

(58) Field of Classification Search
None
See application file for complete search history.

(56) References Cited

U.S. PATENT DOCUMENTS 3,946,278 A * 3/1976 Hufnagel .................. G05F 3/18
361/56
7,511,357 B2 3/2009 Hshieh
(Continued)

FOREIGN PATENT DOCUMENTS

| DE | 102006023429 A1 | 11/2007 |
|---|---|---|
| DE | 202004021424 U1 | 2/2008 |
| DE | 102014105790 A1 | 10/2015 |

*Primary Examiner* — Evren Seven
(74) *Attorney, Agent, or Firm* — Murphy, Bilak & Homiller, PLLC

(57) ABSTRACT

A semiconductor device includes a semiconductor body having a first surface and a second surface opposite to the first surface. A first isolation layer is provided over the first surface of the semiconductor body. The semiconductor device further includes an electrostatic discharge protection structure over the first isolation layer. The electrostatic discharge protection structure has a first terminal region of a first conductivity type and a second terminal region of a second conductivity type opposite to the first conductivity type.

16 Claims, 22 Drawing Sheets

(51) Int. Cl.
    *H01L 29/866*     (2006.01)
    *H01L 29/78*     (2006.01)
    *H01L 29/16*     (2006.01)
    *H01L 23/62*     (2006.01)
    *H01L 29/423*     (2006.01)
    *H01L 29/739*     (2006.01)

(56) References Cited

U.S. PATENT DOCUMENTS

| | | | |
|---|---|---|---|
| 9,679,887 B1* | 6/2017 | Huang | H01L 27/0266 |
| 2005/0077577 A1 | 4/2005 | Manna et al. | |
| 2009/0230500 A1* | 9/2009 | Yoshikawa | H01L 27/0255 |
| | | | 257/470 |
| 2010/0295111 A1* | 11/2010 | Kawashima | H01L 27/0255 |
| | | | 257/314 |
| 2013/0127063 A1 | 5/2013 | Abou-Khalil et al. | |
| 2015/0340357 A1* | 11/2015 | Edwards | H01L 27/0259 |
| | | | 257/362 |
| 2016/0268249 A1* | 9/2016 | Tsuzuki | H01L 27/0255 |
| 2017/0092584 A1* | 3/2017 | Sheng | H01L 23/5256 |
| 2018/0096985 A1* | 4/2018 | Weyers | H01L 27/0255 |
| 2018/0096991 A1* | 4/2018 | Nasu | H01L 29/4236 |
| 2018/0145065 A1* | 5/2018 | Holland | H01L 27/0255 |
| 2018/0226348 A1* | 8/2018 | Hsieh | H01L 23/5387 |
| 2018/0301537 A1* | 10/2018 | Weyers | H01L 27/0255 |

\* cited by examiner

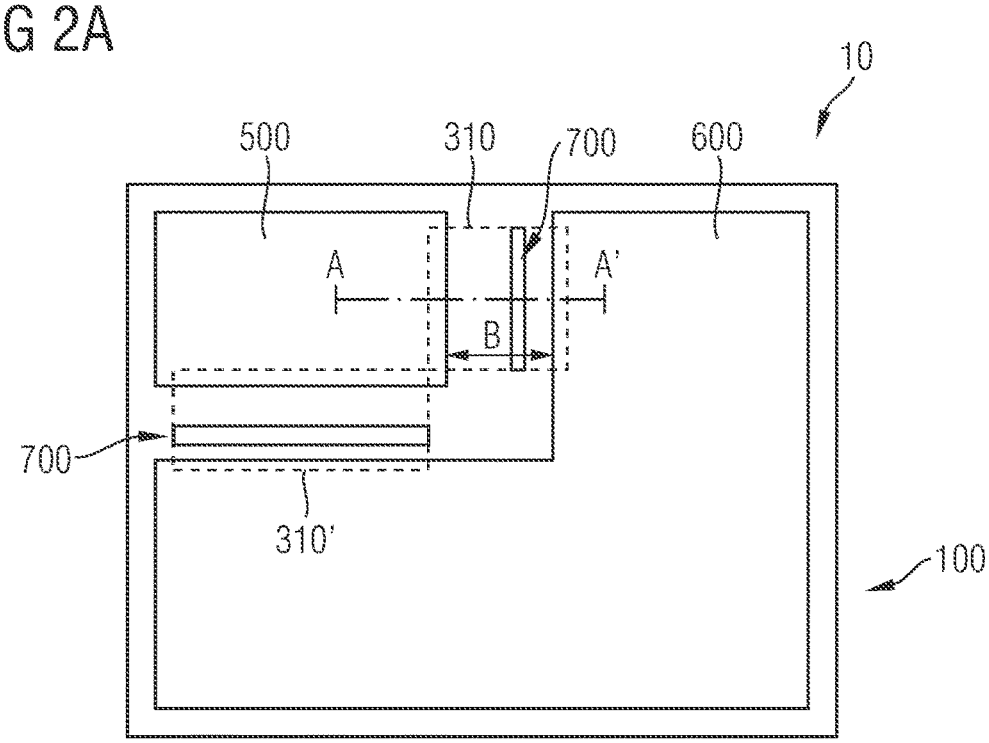
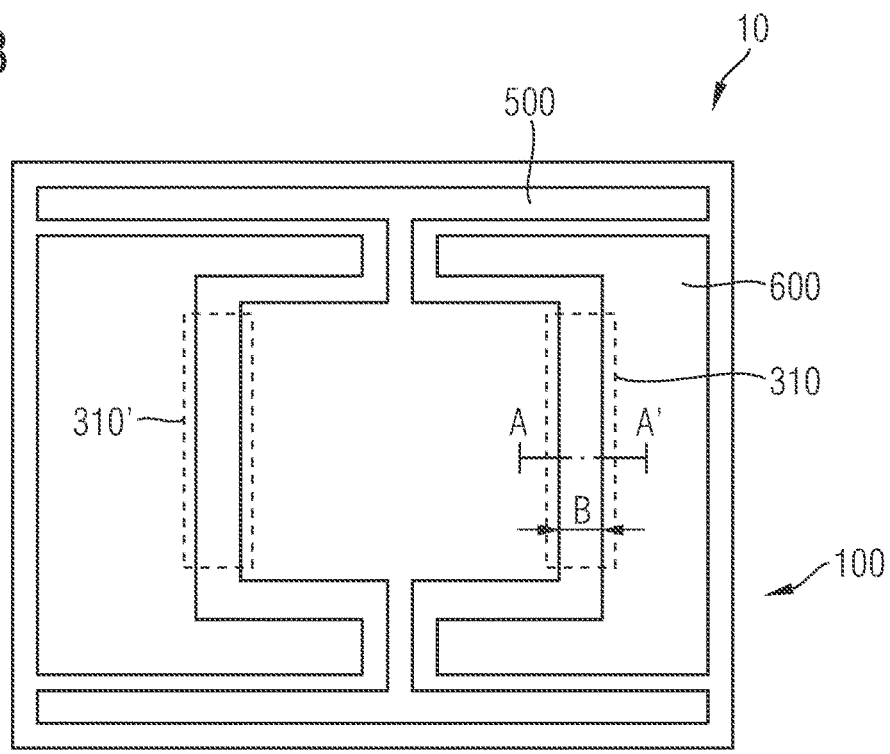

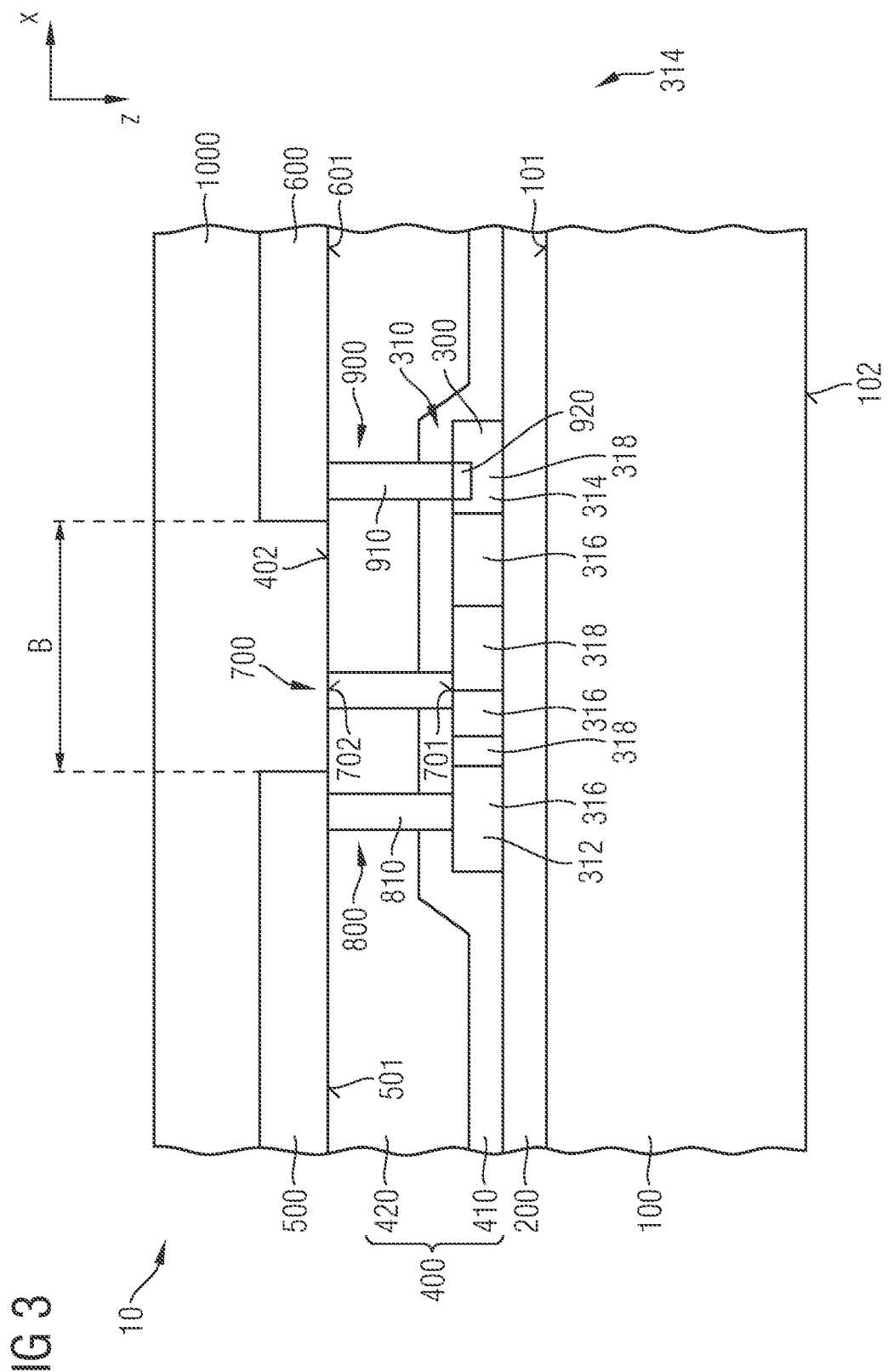

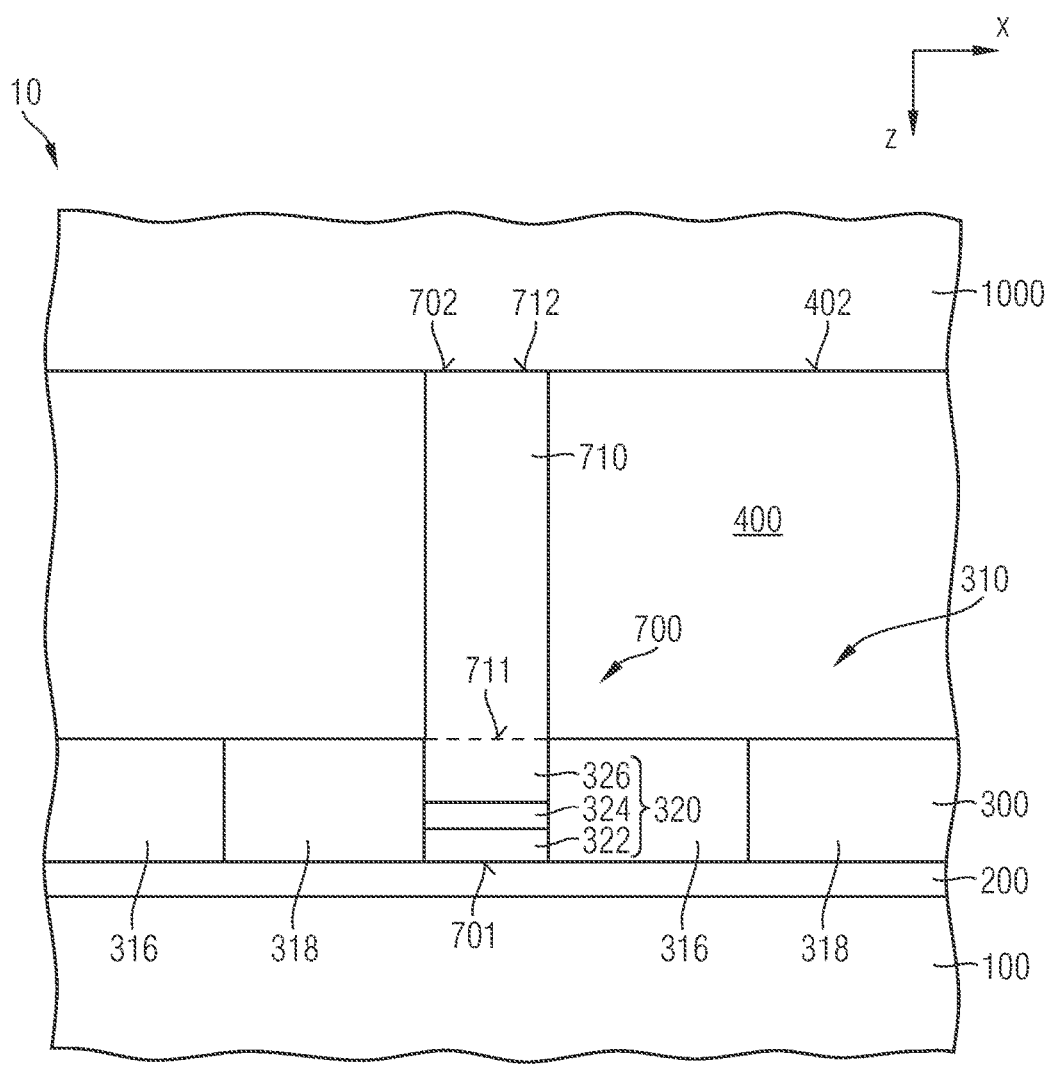

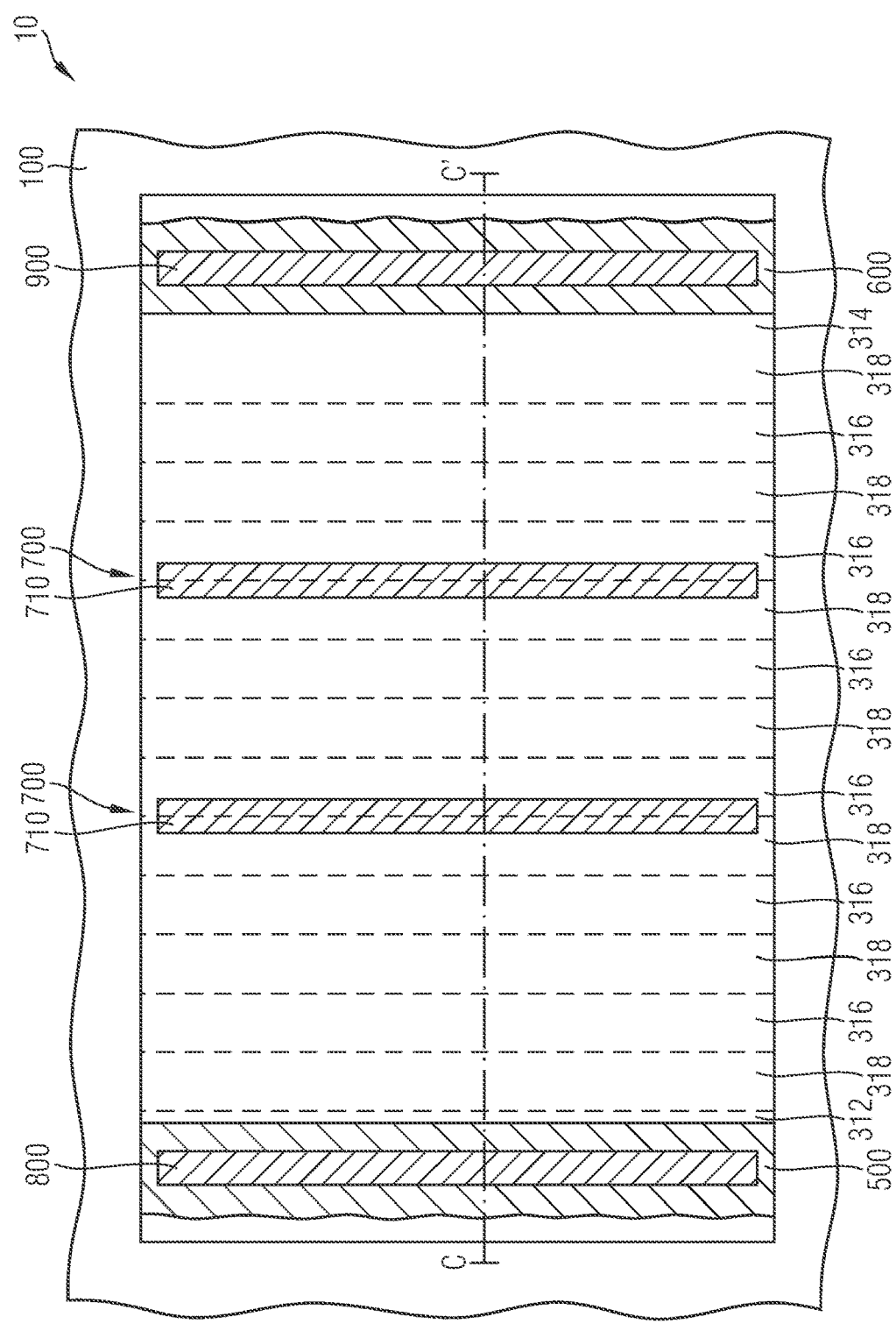

SEMICONDUCTOR DEVICE HAVING AN ELECTROSTATIC DISCHARGE PROTECTION STRUCTURE

BACKGROUND

A key component in semiconductor applications is a solid-state switch. As an example, switches turn loads of automotive applications or industrial applications on and off. Solid-state switches typically include, for example, field effect transistors (FETs) like metal-oxide-semiconductor FETs (MOSFETs) or insulated gate bipolar transistors (IGBTs).

In these applications, a damage of a gate dielectric between gate and source of the transistors may be caused by an electrostatic discharge event between a gate contact area and a source contact area of the semiconductor device. To protect the gate dielectric from an electrostatic discharge event, electrostatic discharge (ESD) protection structures are provided, which protect the transistors from electrostatic discharge during assembly or operation, for example. These ESD protection structures require non-negligible area within the integrated semiconductor device.

Furthermore, when providing a symmetrical electrostatic discharge (ESD) protection structure between a gate and source contact structure, an asymmetric robustness of the device in view of the ESD polarity between gate and source leads to restraints in tests of the semiconductor devices.

It is thus desirable to provide a semiconductor device structure with enhanced ESD protection and thermal characteristics, having at the same time an optimized area efficiency.

SUMMARY

According to an embodiment of a semiconductor device, a semiconductor device comprises a semiconductor body having a first surface and a second surface opposite to the first surface. A first isolation layer is provided over the first surface of the semiconductor body. The semiconductor device further comprises an electrostatic discharge protection structure over the first isolation layer. The electrostatic discharge protection structure has a first terminal region of a first conductivity type and a second terminal region of a second conductivity type opposite to the first conductivity type.

According to an embodiment of a method of manufacturing a semiconductor device, the method comprises providing a semiconductor body having a first surface and a second surface opposite to the first surface. A first isolation layer is formed over the first surface of the semiconductor body. An electrostatic discharge protection structure is formed over the first isolation layer. The electrostatic discharge protection structure has a first terminal region of a first conductivity type and a second terminal region of a second conductivity type opposite to the first conductivity type.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIGS. 2A and 2B are schematic plan views of a portion of a semiconductor device in accordance with different embodiments.

FIG. 3 is a schematic cross-sectional view of a portion of a semiconductor device taken along a section plane A-A' of FIG. 2A or FIG. 2B in accordance with an embodiment.

FIG. 4 is a detailed view of a portion of a semiconductor device of FIG. 3.

FIG. 7A is a schematic plan view of a portion of a semiconductor device in accordance with another embodiment.

DETAILED DESCRIPTION

Figure 1A:
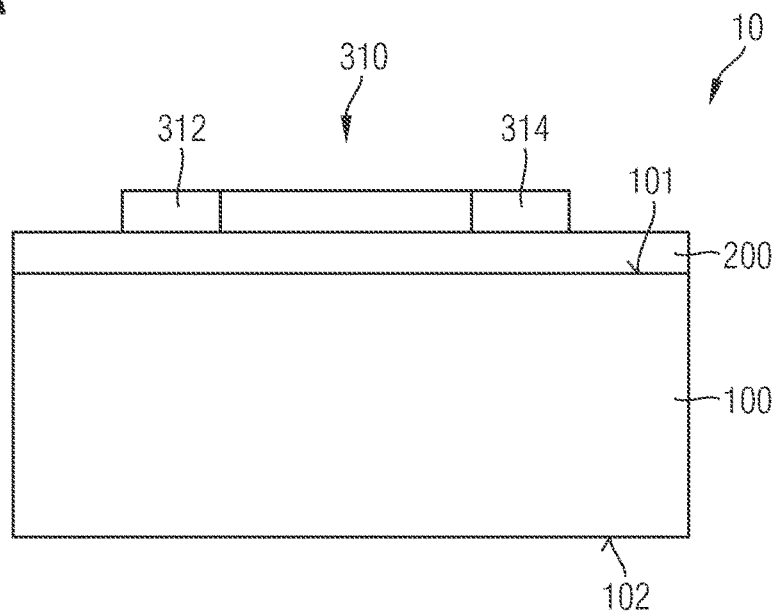
FIG. 1A is a schematic cross-sectional view of a portion of a semiconductor device in accordance with an embodiment.

In the following detailed description, reference is made to the accompanying drawings, which form a part hereof, and in which are shown by way of illustrations specific embodiments in which the invention may be practiced. It is to be understood that other embodiments may be utilized and structural and logical changes may be made without departing from the scope of the present invention. For example features illustrated or described for one embodiment can be used on or in conjunction with other embodiments to yield yet a further embodiment. It is intended that the present invention include such modifications and variations. The examples are described using specific language, which should not be construed as limiting the scope of the appending claims. The drawings are not scaled and for illustrative purpose only. For clarity, corresponding elements have been designated by the same references in the different drawings if not stated otherwise.

The terms "having", "containing", "including", "comprising" and the like are open and the terms indicate the presence of stated structures, elements or features but not preclude additional elements or features.

The terms "one after another", "successively" and the like indicate a loose ordering of elements not precluding additional elements placed in between the ordered elements.

The articles "a", "an", and "the" are intended to include the plural as well as the singular, unless the context clearly indicates otherwise.

In this specification, n-type or n-doped may refer to a first conductivity type while p-type or p-doped is referred to a second conductivity type. Semiconductor devices can be formed with opposite doping relations so that the first conductivity type can be p-doped and the second conductivity type can be n-doped. Furthermore, some figures illustrate relative doping concentrations by indicating "−" or "+" next to the doping type. For example, "n$^-$" means a doping concentration less than the doping concentration of an "n"-doping region while an "n$^+$"-doping region has a larger doping concentration than the "n"-doping region. Indicating the relative doping concentration does not, however, mean that doping regions of the same relative doping concentration have the same absolute doping concentration unless otherwise stated. For example, two different n$^+$ regions can have different absolute doping concentrations. The same applies, for example, to an n$^+$ and a p$^+$ region.

The first conductivity type may be n- or p-type provided that the second conductivity type is complementary.

The term "electrically connected" describes a permanent low-ohmic connection between electrically connected elements, for example a direct contact between the concerned elements or a low-ohmic connection via a metal and/or highly doped semiconductor.

The terms "wafer", "substrate", "semiconductor body" or "semiconductor substrate" used in the following description may include any semiconductor-based structure that has a semiconductor surface. Wafer and structure are to be understood to include silicon (Si), silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon germanium (SiGe), germanium (Ge) or gallium arsenide (GaAs). According to other embodiments, silicon carbide (SiC) or gallium nitride (GaN) may form the semiconductor substrate material.

The term "horizontal" as used in this specification intends to describe an orientation substantially parallel to a first or main surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

Processing of a semiconductor wafer may result in semiconductor devices having terminal contacts such as contact pads (or electrodes) which allow electrical contact to be made with the integrated circuits or discrete semiconductor devices included in the semiconductor body. The electrodes may include one or more electrode metal layers which are applied to the semiconductor material of the semiconductor chips. The electrode metal layers may be manufactured with any desired geometric shape and any desired material composition. The electrode metal layers may, for example, be in the form of a layer covering an area. Any desired metal, for example Cu, Ni, Sn, Au, Ag, Pt, Pd, and an alloy of one or more of these metals may be used as the material. The electrode metal layer(s) need not be homogenous or manufactured from just one material, that is to say various compositions and concentrations of the materials contained in the electrode metal layer(s) are possible. As an example, the electrode layers may be dimensioned large enough to be bonded with a wire.

In embodiments disclosed herein one or more conductive layers, in particular electrically conductive layers, are applied. It should be appreciated that any such terms as "formed" or "applied" are meant to cover literally all kinds and techniques of applying layers. In particular, they are meant to cover techniques in which layers are applied at once as a whole like, for example, laminating techniques as well as techniques in which layers are deposited in a sequential manner like, for example, sputtering, plating, molding, CVD (Chemical Vapor Deposition), physical vapor deposition (PVD), evaporation, hybrid physical-chemical vapor deposition (HPCVD), etc.

The applied conductive layer may comprise, inter alia, one or more of a layer of metal such as Cu or Sn or an alloy thereof, a layer of a conductive paste and a layer of a bond material. The layer of a metal may be a homogeneous layer. The conductive paste may include metal particles distributed in a vaporizable or curable polymer material, wherein the paste may be fluid, viscous or waxy. The bond material may be applied to electrically and mechanically connect the semiconductor chip, e.g., to a carrier or, e.g., to a contact clip. A soft solder material or, in particular, a solder material capable of forming diffusion solder bonds may be used, for example solder material comprising one or more of Sn, SnAg, SnAu, SnCu, In, InAg, InCu and InAu.

A dicing process may be used to divide the semiconductor wafer into individual chips. Any technique for dicing may be applied, e.g., blade dicing (sawing), laser dicing, etching, etc. The semiconductor body, for example a semiconductor wafer may be diced by applying the semiconductor wafer on a tape, in particular a dicing tape, apply the dicing pattern, in particular a rectangular pattern, to the semiconductor wafer, e.g., according to one or more of the above mentioned techniques, and pull the tape, e.g., along four orthogonal directions in the plane of the tape. By pulling the tape, the semiconductor wafer gets divided into a plurality of semiconductor dies (chips).

It is to be understood that the features of the various embodiments described herein may be combined with each other, unless specifically noted otherwise.

FIG. 1A is a schematic cross-sectional view of a portion of a semiconductor device 10 in accordance with an embodiment. The semiconductor device 10 comprises a semiconductor body 100 having a first surface 101 and a second surface 102 opposite to the first surface 101. The semiconductor device 10 further comprises a first isolation layer 200 on or over the first surface 101 of the semiconductor body 100 and an electrostatic discharge protection structure 310 on or over the first isolation layer 200. The electrostatic discharge protection structure 310 comprises a first terminal region 312 of a first conductivity type and a second terminal region 314 of a second conductivity type opposite to the first conductivity type.

Figure 1B:
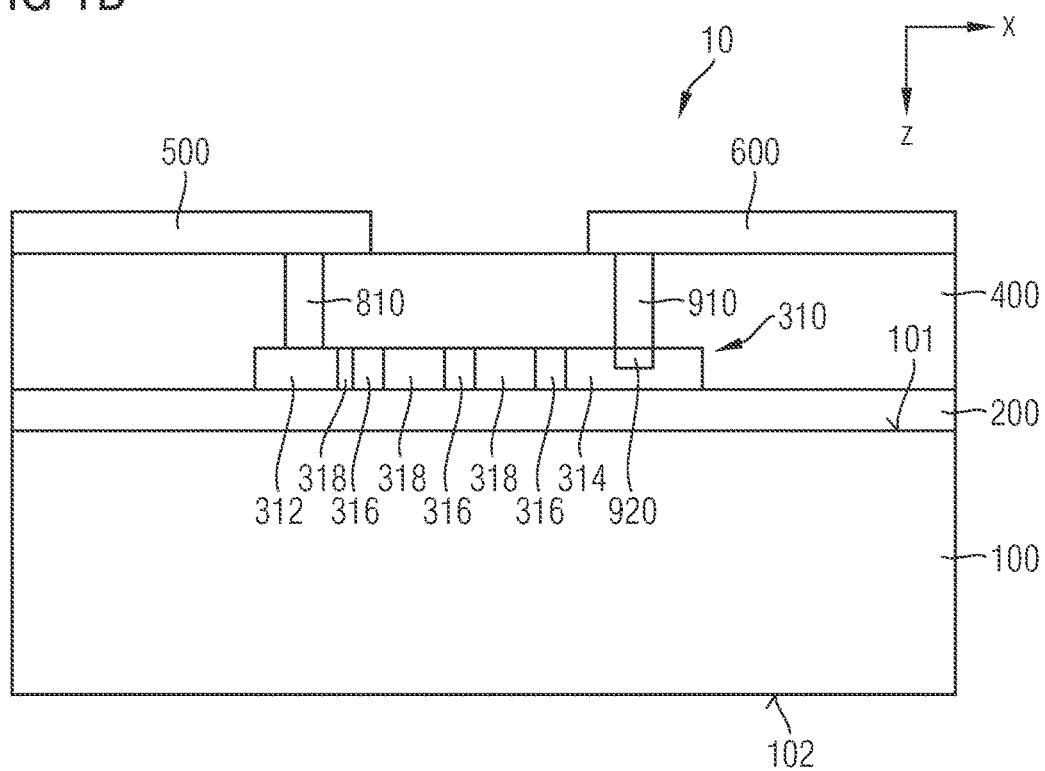
FIG. 1B is a schematic cross-sectional view of a portion of a semiconductor device in accordance with an embodiment.

FIG. 1B is a schematic cross-sectional view of a portion of a semiconductor device 10 in accordance with an embodiment. A second isolation layer 400 is provided on or over the electrostatic discharge protection structure 310. On or over the second isolation layer 400, a first electrode 500 and a second electrode 600 are formed. The first electrode 500 is electrically coupled to the first terminal region 312 via a first contact element 810 and the second electrode 600 is electrically coupled to the second terminal region 314 via a second contact element 910. The second contact element 910 is of a first conductivity type and the second terminal region 314 is of a second conductivity type opposite to the first conductivity type. A terminal shunting structure 920 electrically shunts a pn-junction between the second terminal region 314 and the second contact element 910.

Due to the provision of the terminal shunting structure 920 electrically shunting a pn-junction between the second terminal region 314 and the second contact element 910, a bidirectional unsymmetrical electrostatic discharge protection structure can be provided, which has different breakdown voltages depending on the polarity of voltage applied between the first and second terminal regions 312, 314.

The semiconductor device 10 may comprise power semiconductor elements such as IGBTs (insulated gate bipolar transistors), e.g. RC-IGBTs (reverse-conducting IGBTs), RB-IGBT (reverse-blocking IGBTs, and IGFETs (insulated gate field effect transistors) including MOSFETs (metal oxide semiconductor field effect transistors). The semiconductor device 10 may also comprise a superjunction transistor, a trench field effect transistor, or any further transistor device controlling a load current via a control terminal.

When reducing the chip size of the semiconductor device 10, a smaller input capacitance results in an enhanced risk of damage caused by an electrostatic discharge event between the gate and the source of the semiconductor device 10. Thus, the electrostatic discharge protection structure 310 may be applied in a power semiconductor element to protect a gate dielectric between a gate and source of a transistor from damage by dissipating energy caused by an electrostatic discharge event between a gate contact area and a source contact area. Usually, monolithically integrated polysilicon Zener diode cascades are inherent bidirectional symmetric devices. For negative electrostatic discharge gate pulses, the electrostatic discharge window is too small. An ESD-HBM (electrostatic discharge-human body model) destruction occurs mainly for negative ESD-HBM stress.

FIGS. 2A and 2B are schematic plan views of portions of a semiconductor device 10 in accordance with different embodiments. As shown in FIG. 2A, the first electrode 500 is provided in a corner portion of the semiconductor device 10 and may act as a gate contact structure 510 (cf. FIG. 9), which may include a gate pad. The gate pad may be used for providing a bonding or soldering contact to the first electrode 500 to be connected to an external device or element. The second electrode 600 is arranged next to the first electrode 500 and may act as a source contact structure 610 (cf. FIG. 9), by which source zones 150 of transistor cells 20 in the semiconductor body 100 are contacted.

When forming the semiconductor device 10 as a power semiconductor element, a resulting thickness of the metallization of the first electrode 500 and the second electrode 600 may be in a range of 1 µm to 10 µm or 3 µm to 7 µm, and the first electrode 500 and the second electrode 600 may be separated by a minimum distance B in a range of 5 µm to 20 µm or 10 µm to 15 µm. As shown in FIG. 2B, the first electrode 500 may be also be arranged in a middle part of the semiconductor device 10, wherein the second electrode 600 surrounds the first electrode 500. Possible locations of the electrostatic discharge protection structure 310 are indicated by dashed lines, wherein the indicated places are only exemplary and should not be understood as limiting.

FIG. 3 is a schematic cross-sectional view of a portion of the semiconductor device 10 taken along a section plane A-A' of FIG. 2A or FIG. 2B in accordance with an embodiment.

The semiconductor body 100 may be provided from a single-crystalline semiconductor material, for example silicon Si, silicon carbide SiC, germanium Ge, a silicon germanium crystal SiGe, gallium nitride GaN or gallium arsenide GaAs. A distance between the first and second surfaces 101, 102 is selected to achieve a specified voltage blocking capability and may be at least 3 µm, or at least 10 µm, or at least 20 µm, for example at least 50 µm. In particular, in case of providing a SiC semiconductor body, the distance between the first and second surfaces 101, 102 may be in a range of 5 µm to 20 µm, or in a range of 3 µm to 10 µm. Other embodiments may provide semiconductor bodies 100 with a thickness of several 100 µm. The semiconductor body 100 may have a rectangular shape with an edge length in the range of several millimeters.

The normal to the first and second surfaces 101, 102 defines a vertical direction z and directions orthogonal to the normal direction are lateral directions. As can be seen, for example, from FIG. 2A and FIG. 2B, the lateral direction x is defined to be extended between the first terminal region 312 and the second terminal region 314. Thus, the lateral direction x is effectively parallel to the direction of a breakdown current within the electrostatic discharge protection structure 310. For the sake of an unambiguous understanding of the invention, the lateral direction x may be defined to be extended along the section plane A-A' of FIG. 2A or FIG. 2B. However, it can easily understood by a person skilled in the art that within a electrostatic discharge protection structure 310' as shown in FIG. 2A, the lateral direction x has to be defined as a direction being orthogonal to the above-defined lateral direction x. Furthermore, as can be seen from FIG. 9, the lateral direction x may be extended even in opposite directions.

The first isolation layer 200 is formed on the first surface 101 of the semiconductor body 100. The first isolation layer 200 may include any dielectric or a combination of dielectrics adapted to isolate the semiconductor body 100 from the electrostatic discharge protection structure 310 on the first isolation layer 200. The first isolation layer 200 may include one or any combination of an oxide, nitride, oxynitride, a high-k material, an imide, an insulating resin or glass, for example. The first isolation layer 200 may include a field dielectric such as a field oxide and/or a gate dielectric such as a gate oxide. The first isolation layer 200 may include a field oxide formed e.g. by a local oxidation of silicon (LOCOS) process, deposited oxide or STI (shallow trench isolation). The thickness of the field dielectric of the first isolation layer 200 may be in a range of 0.5 µm to 5 µm or 1 µm to 3 µm, the thickness of the gate dielectric of the first isolation layer 200 may be in a range of 5 nm to 200 nm or 40 nm to 120 nm.

The second isolation layer 400 is formed on the electrostatic discharge protection structure 310 and the first isolation layer 200. The second isolation layer may comprise silicon nitride. The second isolation layer 400 may comprise a stack of first and a second dielectric layers 410 and 420. According to an embodiment, the first dielectric layer 410 may include a tetraethyl orthosilicate (TEOS)/undoped silicate glass (USG) film. The thickness of the first dielectric layer of the second isolation layer 400 may be in a range of 50 nm to 500 nm. The second dielectric layer 420 may include a phosphosilicate glass (PSG) or a borophosphosilicate glass (BPSG). The thickness of the second dielectric layer of the second isolation layer 400 may be in a range of 200 nm to 2 µm.

The first electrode 500 is formed on the second isolation layer 400. Next to the first electrode 500, the second electrode 600 is formed on the second isolation layer 400, which may be spaced apart from the first electrode 500 by the distance B (cf. also FIG. 2A and FIG. 2B). On the first electrode 500 and the second electrode 600, a passivation layer 1000 is formed, which may include one or any combination of an imide, a nitride, an oxide or an oxynitride, for example.

The first electrode 500 and the second electrode 600 may be separate parts, e.g. due to lithographic patterning of a common metal wiring layer of a same wiring level, wherein the semiconductor device 10 comprises only a single metal wiring layer. The first electrode 500 and the second electrode 600 may be formed as a metal layer structure, which may consist of or contain, as main constituent(s), aluminum Al, copper Cu or alloys of aluminum or copper, for example AlSi, AlCu, or AlSiCu. According to other embodiments, the first electrode 500 and the second electrode 600 may contain one, two, three or more sub-layers, each sub-layer containing, as a main constituent, at least one of nickel Ni, titanium Ti, silver Ag, gold Au, tungsten W, platinum Pt, tantalum Ta and palladium Pd. For example, a sub-layer may contain a metal nitride or a metal alloy containing Ni, Ti, Ag, Au, W, Pt, Co and/or Pd.

The electrostatic discharge protection structure 310 may include a series connection of at least one polysilicon diode. As shown in FIG. 3, the electrostatic discharge protection structure 310 may comprise a polysilicon layer 300 on the first isolation layer 200 having first regions 316 and second regions 318 of opposite conductivity type alternatingly arranged along the lateral direction x. According to the embodiment as shown in FIG. 3, the first terminal region 312 and the second terminal region 314 are located in a region within the polysilicon layer 300, which is electrically contacted by the first and second contact elements 810 and 910, respectively. Thus, the term "terminal region" has to be understood as a part of the polysilicon layer 300 constituting the electrostatic discharge protection structure 310. A terminal region 312 or 314 may thus be a part of a first region 316 or the second region 318 within the polysilicon layer 300 constituting the electrostatic discharge protection structure 310. Thus, in case the first terminal region 312 is part of a first region 316, the first terminal region 312 has the same conductivity type as the first regions 316. In case the first terminal region 312 is part of a second region 318, the first terminal region 312 has the same conductivity type as the second regions 318. In case the second terminal region 314 is part of a first region 316, the second terminal region 314 has the same conductivity type as the first regions 316. In case the second terminal region 314 is part of a second region 318, the second terminal region 314 has the same conductivity type as the second regions 318.

In detail, the electrostatic discharge protection structure 310 may be manufactured by forming the polysilicon layer 300 of a first conductivity type on the first isolation layer 200. After forming the polysilicon layer 300, a mask layer (not shown), e.g. a hard mask layer or a resist layer may be formed on the polysilicon layer 300 and is patterned by a lithographic process, such that the second regions 318 are not covered by the mask layer. In a subsequent implantation process, dopants of a second conductivity type are introduced into the exposed second regions 318 not covered by the mask layer on the polysilicon layer 300, to form the second regions 318 of the second conductivity type. Thus, each of the first regions 316 and second regions 318 comprises first dopants of the first conductivity type, and the second regions 318 further comprise second dopants of the second conductivity type overcompensating the first dopants of the first conductivity type. In another embodiment, each of the first regions 316 may comprise first dopants of the first conductivity type and the second regions 318 may comprise second dopants of the second conductivity type only, without overcompensating the first dopants of the first conductivity type. Herein, the first dopants are introduced into the first regions 316 and the second dopants are introduced into the second regions 318, respectively, in a separate process, e.g. by ion implantation and/or diffusion, wherein overlapping regions between the first and second regions 316, 318 may comprise first and second dopants due to the diffusion of the dopants.

As a result, a polysilicon diode chain or string arranged in a lateral direction x having alternating pn-junctions (diodes) at the region boundaries of the first and second regions 316, 318 in the polysilicon layer 300 is formed. In an embodiment, the doping concentrations of the regions are adapted such that a series connection of Zener diodes are formed within the polysilicon layer 300. By the number of consecutive diodes each including a first region 316 and a second region 318, the breakdown voltage of the electrostatic discharge protection structure 310 can be adjusted.

A reduction of the electrostatic discharge voltage window for positive and negative voltages is important for an optimal fitting of the electrostatic discharge protection structure 310 to tests of a load metal oxide semiconductor device having an integrated electrostatic discharge diode. The smaller the variance of the device parameters, the nearer the breakdown voltage of an anti-serial diode chain may be brought to a desired value such as a maximum allowable voltage between gate and source (VGS value).

If the electrical breakdown behaviour of the gate oxide of the load metal oxide semiconductor device is unsymmetrical, the ESD protection diode electrical behaviour can be adjusted to the load metal oxide semiconductor device.

This means, if the load metal oxide semiconductor device has a lower gate oxide breakdown voltage for one direction, the electrostatic discharge voltage window for positive and negative voltages of the electrostatic discharge (ESD) diode can be chosen unsymmetrical to reach an increased ESD HBM (electrostatic discharge-human body model) capability of the load metal oxide semiconductor device.

The polysilicon layer 300 deposited on the first isolation layer 200 may have a large grain-size of polysilicon. Thus, the lateral dimension of the electrostatic discharge protection structure 310 comprising a poly Zener diode chain may be e.g. in a range of 1 µm to 10 µm or 3 µm to 5 µm. By extending the electrostatic discharge protection structure 310 over a plurality of grain boundaries of the polysilicon layer 300, a stable breakdown characteristic of the electrostatic discharge protection structure 310 is provided. In some embodiments, a plurality of grain boundaries within the polysilicon layer 300 may lead to an electron mobility in a range of 1 $cm^2$/Vs to 5 $cm^2$/Vs. In case of improving the granular structure of the polysilicon layer 300, the electron mobility may be increased to 50 $cm^2$/Vs due to less grain boundaries within the polysilicon layer 300. A further improvement may be achieved by depositing amorphous silicon followed by a laser melting process. Such a polycrystalline silicon is called low temperature polysilicon (LTPS). The electron mobility of low temperature polysilicon is in a range of 100 $cm^2$/Vs to 700 $cm^2$/Vs.

Even higher electron mobility values may be achieved by polycrystalline silicon having even greater grain-boundary sizes. An example of such a polycrystalline silicon is a continuous-grain-silicon (CGS), which leads to an electron mobility in a range of 500 $cm^2$/Vs to 700 $cm^2$/Vs. By provision of a continuous grain silicon within the polysilicon layer 300, electron mobility values may be achieved, which are comparable to that within the bulk region of the semiconductor body 100.

The polysilicon layer 300 may thus comprise at least one of a low temperature polysilicon (LTPS) and a continuous grain silicon (SGS).

The length of the electrostatic discharge protection structure 310 between the first terminal region 312 and the second terminal region 314, respectively, may be in a range of 5 µm to 150 µm or 15 µm to 50 µm. An area of the electrostatic discharge protection structure 310 according to FIGS. 2A and 2B or FIGS. 3 and 8 may be in a range of 100 µm×50 µm×2=10000 µm², by providing a small gate pad length of 100 µm, an electrostatic discharge protection structure 310 on two orthogonal sides (FIG. 2A) or symmetrical on two opposite sides (FIG. 2B) of the gate pad. The area of the electrostatic discharge protection structure 310 may be up to 500 µm×50 µm×2=50000 µm² or up to 2000 µm×50 µm×2=200.000 µm², by providing a large gate pad length of 1000 µm. The area of the electrostatic discharge protection structure 310 does not increase the total chip area, because the diode is constructed between and partially beneath the metal.

An electrostatic discharge protection structure 310 having a diode width in a range between 1000 µm to 2000 µm may be integrated along the gate contact structure 510 or furthermore within an edge termination structure of the semiconductor device 10, wherein the semiconductor device 10 may be a superjunction metal oxide semiconductor field effect transistor device or an insulated gate bipolar transistor (IGBT) device. Such an embodiment may be advantageous in case of providing a semiconductor device 10 having a small die area (smaller than 1 mm²), wherein a robustness of the electrostatic discharge protection structure 310 with respect to HBM (Human Body Model) tests may be in a range of 1 kV to 4 kV. Assuming a breakdown current of 1 mA per µm diode width, a robustness of the electrostatic discharge protection structure 310 with respect to HBM (Human Body Model) tests may be in a range of 300 V to 4 kV.

The area of the electrostatic discharge protection structure 310 may be appropriately chosen for dissipating energy caused by an electrostatic discharge event (ESD event) between the first electrode 500 and the second electrode 600.

The first electrode 500 may be electrically coupled to the first terminal region 312 of the electrostatic discharge protection structure 310 via a first contact structure 800 comprising the first contact element 810 and the second electrode 600 may be electrically coupled to the second terminal region 314 of the electrostatic discharge protection structure 310 via a second contact structure 900 comprising the second contact element 910. The shunting structure 700 extends through the second isolation layer 400, wherein the first end 701 is in direct contact with the electrostatic discharge protection structure 310 and the second end 702 is not in direct electrical contact to any conduction region such as the first electrode 500 or the second electrode 600. Thus, a first electrode 500 is formed over the second isolation layer 400, wherein the first electrode 500 is electrically coupled to the first terminal region 312. In addition, a second electrode 600 is provided over the second isolation layer 400, wherein the second electrode 600 is electrically coupled to the second terminal region 314. As already discussed above, the first electrode 500 may comprise a gate contact structure 510 or a gate pad and the second electrode 600 may comprise a source contact structure 610 or source pad of transistor cells 20, as will be further discussed in detail with FIG. 9.

As shown in FIG. 3, the second end 702 is in direct contact to an electrically isolating region, which is formed by the passivation layer 1000 covering the second isolation layer 400. The second end 702 is thus electrically isolated from the first terminal region 312 and the second terminal region 314 provided that the connection of the second end 702 to the first and second terminal regions 312, 314 via the first end 701 of the shunting structure 700 and the electrostatic discharge protection structure 310 is not considered. In other words, there is no further conducting path from the second end 702 to the first and second terminal regions 312, 314 except the conducting path via the first end 701 and the electrostatic discharge protection structure 310. According to an embodiment, the shunting structure 700 may be embedded within an electrically isolating region formed by the second isolation layer 400 and the passivation layer 1000, wherein only the first end 701 of the shunting structure 700 is in direct electrical contact to the electrostatic discharge protection structure 310.

The shunting structure 700 may be formed simultaneously with the first and second contact structures 800 and 900 by forming trenches 450, 450a, 450b through the second isolation layer 400 and the polysilicon layer 300, as will be discussed below. The simultaneous formation of the first and second contact structures 800 and 900 together with the shunting structure 700 leads to a beneficial manufacturing process. When forming the first electrode 500 and the second electrode 600 on the second isolation layer 400 to be electrically coupled with the first contact structure 800 and the second contact structure 900, respectively, the bottom side 501 (FIG. 3) of the first electrode 500 and the bottom side 601 of the second electrode 600 are at a same vertical level as the second end 702 of the shunting structure 700. The second end 702 of the shunting structure 700 may be flush with the top surface 402 of the second isolation layer 400 in case the second isolation layer 400 has a planarized top surface 402.

Thus, a bottom side 501 of the first electrode 500 and the second end 702 of the shunting structure 700 may be at a same vertical level. Furthermore, the shunting structure 700 and the first contact structure 800 may comprise a same material. In addition, the shunting structure 700 and the second contact structure 900 may comprise a same material. Furthermore, the shunting structure 700 and the first contact structure 800 electrically coupled to the first terminal region 312 may extend through or may penetrate the second isolation layer 400.

According to the embodiment of FIG. 3, the second terminal region 314 is of a second conductivity type, wherein the first contact element 810, the second contact element 910 and the first terminal region 312 are of a first conductivity type. The second contact structure 900 comprises the terminal shunting structure 920, which is provided to shunt the pn-junction between the second contact element 910 and the second terminal region 314, as will be discussed in more detail below.

The electrostatic discharge protection structure 310 embedded between the first isolation layer 200 and the second isolation layer 400 has a high thermal impedance due to the thermal isolation by materials like PSG, TEOS, polyoxide or field oxides. The thickness of the electrostatic discharge protection structure 310 may be in a range of 100 nm to 1000 nm, or in a range of 200 nm to 600 nm, or may be in a range between 200 nm to 500 nm, for example. Due to the small thickness of the electrostatic discharge protection structure 310 in comparison to its lateral dimensions, the transient thermal capacity, i.e. the thermal capacity which may buffer short thermal dissipation peaks, is low, which may lead to a deterioration of the electrostatic discharge protection structure 310 or further damages of the semiconductor device 10.

Due to the provision of the shunting structure 700, the thermal capacity of the electrostatic discharge protection structure 310 is increased. A thickness of the shunting structure 700 along a lateral direction (extending from the first terminal region 312 to the second terminal region 314 of the electrostatic discharge protection structure 310) may be in a range of 100 nm to 3000 nm and a thickness of the shunting structure 700 along a vertical direction may be in a range of 1000 nm to 2000 nm or 350 nm to 3500 nm.

Thus, a ratio of a thickness of the shunting structure 700 along the vertical direction z and a thickness of the electrostatic discharge protection structure 310 along the vertical direction z may be greater than 1, greater than 2, greater than 3, or greater than 10. By providing the shunting structure 700, the effective thickness relevant for the thermal capacity is increased, leading to an improved electrostatic discharge protection structure 310 with enhanced thermal robustness.

As can be seen from FIG. 3, the first end 701 of the shunting structure 700 is in contact with a pn-junction between one of the first regions 316 and one of the second regions 318 of the electrostatic discharge protection structure 310 such that the pn-junction between the respective first and second regions 316, 318 is electrically shunted.

A detailed view of a portion of the semiconductor device 10 of FIG. 3 is shown in FIG. 4. The shunting structure 700 comprises a shunting element 710 which is aligned such that a first end 711 of the shunting element 710 is in electrical contact with both one of the first regions 316 and one of the second regions 318, wherein a second end 712 of the shunting element 710 is in direct contact to an electrically isolating region. As can be seen from FIG. 4, the shunting structure 700 may further comprise an intermediate region 320. The intermediate region 320 is interposed between one of the first regions 316 and one of the second regions 318 along the lateral direction x. The intermediate region 320 is further interposed between the first isolation layer 200 and the first end 711 of the shunting element 710 along the vertical direction z. Thus, the shunting structure 700 comprises a shunting element 710 and an intermediate region 320, the intermediate region 320 being extended into the electrostatic discharge protection structure 310 along a vertical direction z. The intermediate region 320 may be further interposed between one of the first regions 316 and one of the second regions 318 along the lateral direction x. Thus, the shunting structure 700 may comprise a shunting element 710 having a first end 711 in electrical contact with both one of the first regions 316 and one of the second regions 318 and a second end 712 in direct contact to an electrically isolating region.

The first end 711 of the shunting element 710 is a plane area of the shunting element 710 facing the boundary surface between the electrostatic discharge protection structure 310 and the second isolation layer 400. The first end 711 of the shunting element 710 is a boundary plane area between the shunting element 710 and the intermediate region 320. As can be seen from FIG. 4, the first end 711 is a plane area, which is flush to the boundary surface between the electrostatic discharge protection structure 310 on the polysilicon layer 300 and the second isolation layer 400.

As will be explained below, the intermediate region 320 is formed by forming a trench penetrating the second isolation layer 400 and the polysilicon layer 300, wherein the trench is filled with a polysilicon or metal material. Thus, the first end 711 is not a boundary surface between regions of different material composition. Rather, the material composition of the intermediate region 320 and the shunting element 710 may be the same. Thus, the intermediate region 320 and the shunting element 710 may comprise a same material. The intermediate region 320 may comprise polysilicon having a net dopant concentration higher than $1 \times 10^{19}$ cm$^{-3}$. The intermediate region 320 may also comprise a metal material such as tungsten, for example.

As can be seen from FIG. 4, the intermediate region 320 may comprise a vertically stacked layer structure of a first polysilicon layer 322 and a second polysilicon layer 326 of different conductivity type. Herein, the intermediate region 320 may comprise a metal silicide layer 324 being interposed between the first and second polysilicon layers 322, 326 in a vertical direction z. Thus, the shunting structure 700 may include the metal silicide layer 324 being in contact with the electrostatic discharge protection structure 310. Due to the provision of the shunting structure 700 comprising the shunting element 710 and the intermediate region 320, a pn-junction between one of the second regions 318 and one of the first regions 316 is shunted. Thus, there is no further pn-junction or diffusive junction formed between two neighboured first and second regions 316, 318 in case a shunting structure 700 is formed at the location of a formerly formed pn-junction between the respective first and second regions 316, 318.

In detail, the first polysilicon layer 322 may be of a second conductivity type and having a net dopant concentration higher than $1 \times 10^{19}$ cm$^{-3}$. Thus, an electrical contact is formed between the first polysilicon layer 322 and the second region 318 having the same conductivity type. In the same way, the second polysilicon layer 326 may be of a first conductivity type and may have a net dopant concentration higher than $1 \times 10^{19}$ cm$^{-3}$. Thus, an electrical contact is formed between the second polysilicon layer 326 and the first region 316 having the same conductivity type. By providing the metal silicide layer 324 being interposed between the first and second polysilicon layer 322, 326, an electrical contact is formed between the first polysilicon layer 322 and the second polysilicon layer 326, since due to the high doping concentration of the first and second polysilicon layer 322, 326, a Schottky contact between the first and second polysilicon layers 322, 326 and the metal silicide layer 324 is prevented.

Thus, due to the provision of the stacked layer of the first polysilicon layer 322 of a second conductivity type on the first isolation layer 200, the metal silicide layer 324 formed directly on the first polysilicon layer 322 of a second conductivity type, and the second polysilicon layer 326 of a first conductivity type directly formed on the metal silicide layer 324, a pn-junction between neighbored first and second regions 316, 318 can be shunted or prevented. The second polysilicon layer 326 and the shunting element 710 of the shunting structure 700 comprise the same material such as polysilicon of a first conductivity type. Due to the provision of the shunting element 710 of the shunting structure 700, furthermore heat may be dissipated. Thus, the shunting structure 700 may also act as an heat dissipation structure. Herein, the ratio of a thickness of the shunting structure 700 along a vertical direction z and a thickness of the electrostatic discharge protection structure 310 along a vertical direction z may be greater than 1, or may be greater than 5, or may be greater than 10, or may be greater than 20. The thickness of the polysilicon layer 300 in a vertical direction z may be in a range of 100 nm to 1000 nm. The thickness of the second isolation layer 400 may be in a range of 350 nm to 3500 nm.

According to an embodiment, the shunting element 710 may comprise a metal material such as tungsten, for example. In addition, the first and second contact elements 810, 910 may also comprise a metal material such as tungsten, for example. In contrary to the case that a shunting element 710 or first and second contact elements 810, 910 comprising a highly doped polysilicon material of a first conductivity type is provided, when providing a shunting element 710 or first and second contact elements 810, 910 comprising a metal material such as tungsten (having a TiSi2 and a TiN barrier), an additional contact implantation of ions of a first conductivity type such as P or As ions may be performed to electrically contact the first terminal region 312 of a first conductivity type (having a net dopant concentration of about $1*10^{17}$ to $1*10^{19}$ cm$^{-3}$). An additional contact implantation of ions of a second conductivity type such as B ions may be not necessary to electrically contact the second terminal region 314 of a second conductivity type in case of having a net dopant concentration of about $1*10^{19}$ to $1*10^{21}$ cm$^{-3}$. In case of providing second regions of a second conductivity type with lower net dopant concentrations, an additional contact implantation of ions of a second conductivity type such as B ions with a dose of higher than $1*10^{15}$ cm$^2$ may be performed. Thus, as can be seen from FIG. 4, the shunting element 710 (and the first and second contact element 810, 910, accordingly) may extend into the polysilicon layer 300 to the first polysilicon layer 322 (or 822 and 922, accordingly), wherein the contact implantation is performed with the first polysilicon layer 322, 822 or 922. In other words, the intermediate region 320, 820 and 920 thus comprises a sandwich structure of the first polysilicon layer 322, 822, 922 and a metal material of the shunting element 710 or the first and second contact elements 810, 910.

Figure 5:
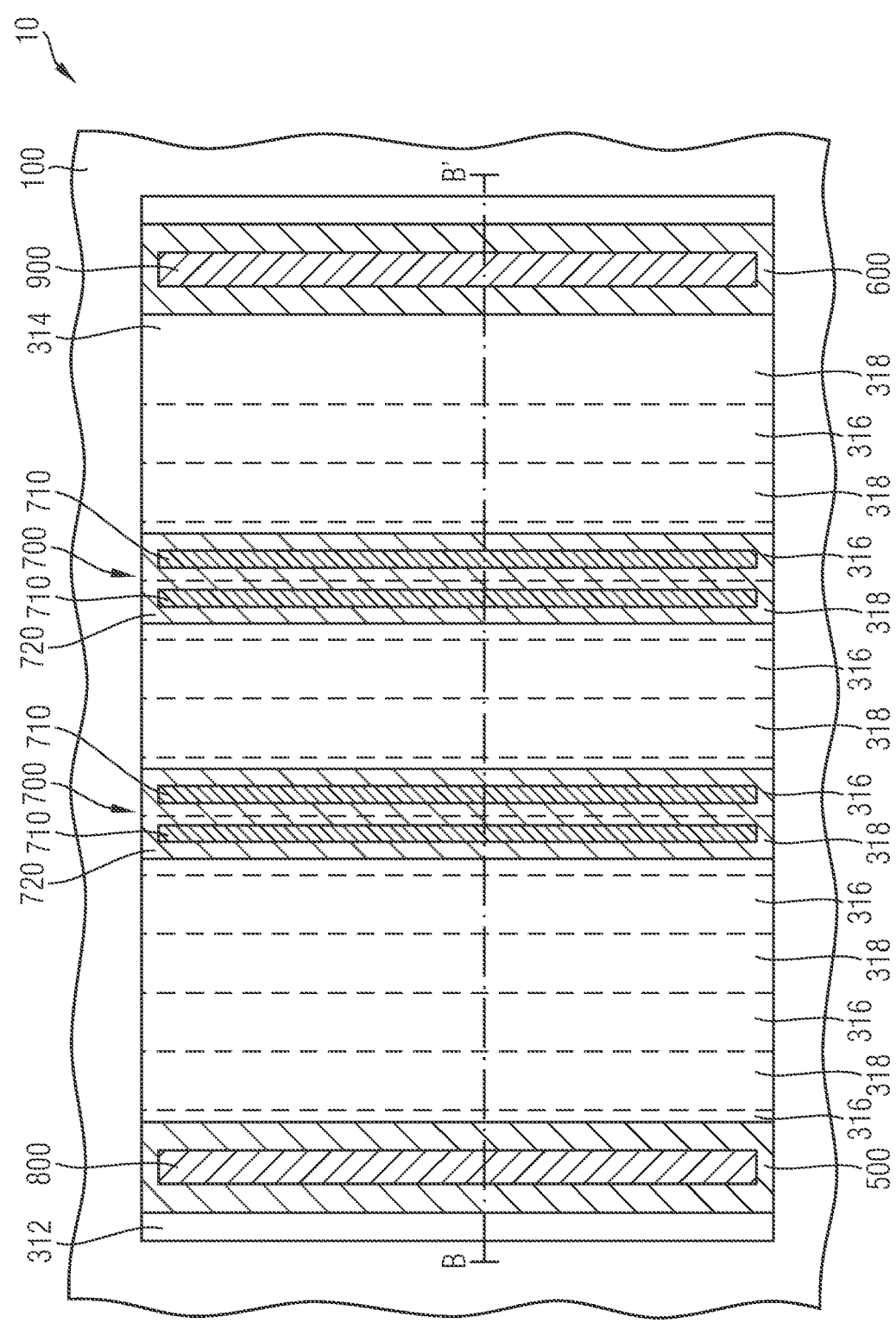
FIG. 5 is a schematic plan view of a portion of a semiconductor device in accordance with an embodiment.
Figure 6:
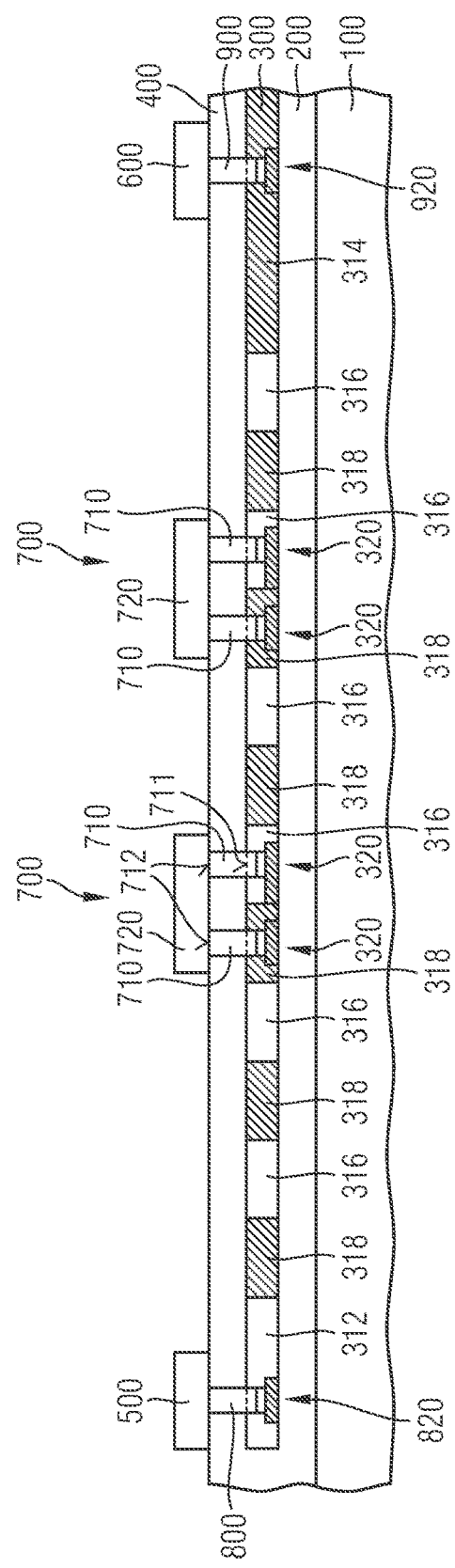
FIG. 6 is a schematic cross-sectional view of a portion of a semiconductor device taken along a section plane B-B' of FIG. 5.

FIG. 5 is a schematic plan view of a portion of a semiconductor device 10 in accordance with an embodiment, wherein FIG. 6 is a schematic cross-sectional view of a portion of a semiconductor device 10 taken along a section plane B-B' of FIG. 5. The embodiment shown in FIGS. 5 and 6 differs from the embodiment as shown in FIGS. 3 and 4 in that the shunting structure 700 comprises two shunting elements 710 having first ends 711 in electrical contact with one of the first regions 316 and one of the second regions 318, respectively, and second ends 712 being electrically interconnected by a shunting element 720.

As can be further seen from FIG. 6, the first electrode 500 and the second electrode 600 are formed simultaneously together with the shunting element 720, by patterning of a same metal layer, for example. The embodiment as shown in FIGS. 5 and 6 may be employed in case that the first electrode 500 and the second electrode 600 comprise a metal layer having an extension along the vertical direction z of below 2 µm. The inner structure of the shunting structure 700 and respective intermediate regions 320 being extended into the electrostatic discharge protection structure 310 may be the same as described above with regard to FIGS. 3 and 4.

However, as can be seen from FIG. 6, due to the provision of two shunting elements 710 separately contacting one of the first regions 316 and one of the second regions 318, a pn-junction between neighbouring first and second regions 316, 318 still exists, but is shunted via the first shunting element 710, the shunting element 720 and the second shunting element 710. In the embodiment as shown in FIGS. 5 and 6, a pn-diode cascade is shown with seven cells. The polysilicon layer 300 may have a thickness of 100 to 1000 nm, or 300 to 600 nm. The cell pitch of each diode formed by respective first and second regions 316, 318 may be in a range between 1 µm (in case of a polysilicon layer 300 having a thickness in a vertical direction z of about 100 nm) to 6 µm, or 3 µm to 5 µm. The extension in lateral direction x of the shunting structure 700 comprising polysilicon filled contact trenches may be in a range between 100 nm to 3000 nm or 150 nm to 1000 nm. The corresponding pn-junctions are short circuited by the metal/n$^{++}$-poly plug/silicide/p$^{++}$-plug, as described above.

According to an embodiment, the electrostatic discharge protection structure 310 may comprise at least 2 or 3 first regions 316 and at least 2 or 3 second regions 318, or may comprise at least 5 first regions 316 and at least 5 second regions 318, or may comprise at least 7 first regions 316 and at least 7 second regions 318.

Figure 7B:
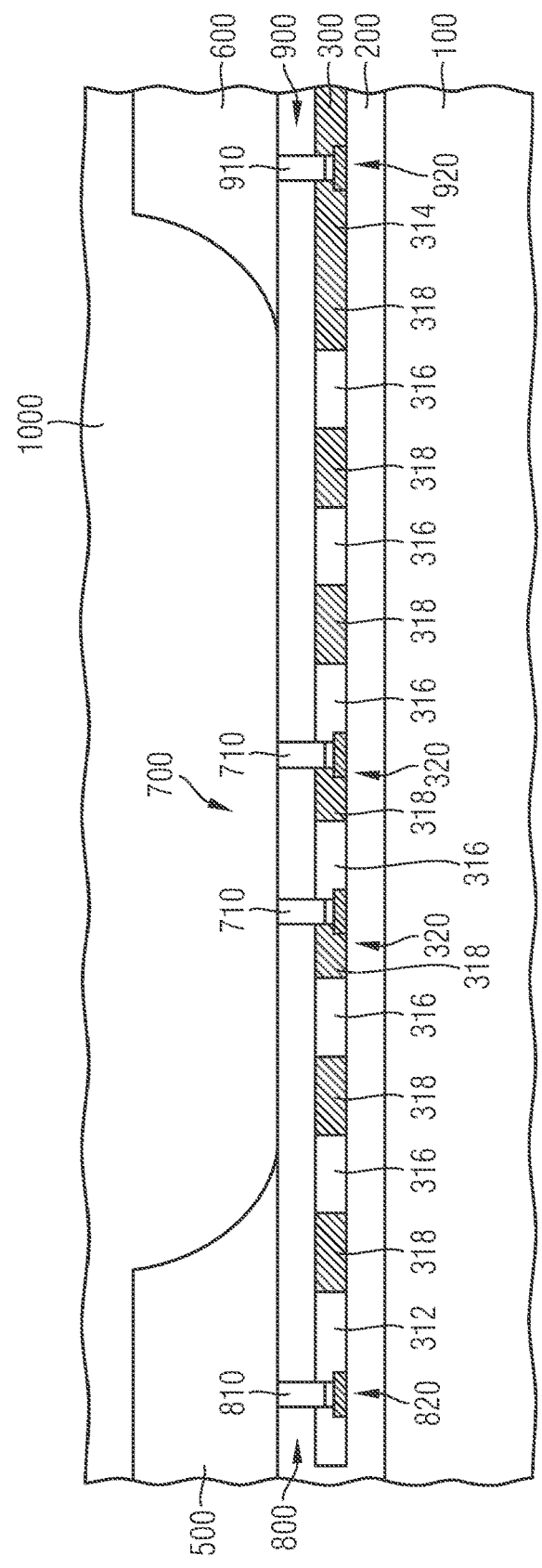
FIG. 7B is a schematic cross-sectional view of a portion of a semiconductor device taken along a section plane C-C' of FIG. 7A.

FIG. 7A is a schematic plan view of a portion of a semiconductor device 10 in accordance with another embodiment, and FIG. 7B is a schematic cross-sectional view of a portion of a semiconductor device 10 taken along a second plane C-C' of FIG. 7A.

As can be seen from FIGS. 7A and 7B, the semiconductor device 10 of FIGS. 7A and 7B is similar to the semiconductor device 10 as shown in FIGS. 3 and 4, subject to the provision of a higher number of first and second regions 316, 318. The embodiment as shown in FIGS. 3 and 4, and in FIGS. 7A and 7B may be employed in case the first electrode 500 and the second electrode 600 comprise a metal layer having an extension along the vertical direction z of at least 3-5 µm. An example of a first electrode 500 and a second electrode 600 having such a thickness of metallization is the provision of the first electrode 500 as a gate contact structure 510 or a gate pad and the provision of the second electrode 600 as a source contact structure 610 or a source pad, as will be discussed below with regard to FIG. 9. Due to the different metal design rules, the shunting elements 720 as shown in FIGS. 5 and 6 cannot be formed between the first electrode 500 and the second electrode 600 in the same metallization patterning process. Thus, the pn-junction between one of the first regions 316 and one of the second regions 318 is shunted by one shunting element 710 only, without providing a shunting element 720. The structure of the shunting structure 700 is the same as described in detail above with regard to FIGS. 3 and 4.

As can be further seen from FIG. 7B, the structure of the first contact structure 800, of the second contact structure 900 comprising the second contact element 910 and the terminal shunting structure 920, and of the shunting structure 700 are the same. Thus, the first contact structure 800, the second contact structure 900 and the shunting structure 700 may be formed simultaneously. As can be seen from FIGS. 7A and 7B, a pn-diode cascade with seven cells is formed. The thickness of the polysilicon layer 300 is in a range between 100 nm-1000 nm or 200 to 600 nm or 300 to 500 nm, the cell pitch of each diode is in a range between 1 µm to 6 µm or 3 to 5 µm, whereas the length of the polysilicon filled contact trenches of the shunting structure 700 in a lateral direction x is in a range between 100 nm to 3 µm or 250 nm to 1000 nm, significantly overlapping the corresponding pn-junctions between a respective first and second region 316, 318.

As can be seen from the embodiment as shown in FIG. 7A and FIG. 7B, the polysilicon plugs may be positioned locally embedded in two pn-junctions. Furthermore, regarding the increased thickness of the polysilicon layer 300 of 400 to 1000 nm, an implanted p-body p$^{++}$-contact zone together with the silicide TiSi$_2$ are relevant, since they do not vanish in the field oxide of the first isolation layer 200.

Thus, a bidirectional unsymmetrical electrostatic discharge structure with k pn-blocking junctions for positive gate-to-source voltage and only e.g. (k−1) pn-blocking junctions for negative gate-to-source voltage may be provided. In former devices, the ESD-HBM capability was about 2.3 kV for positive pulses, but only about 1.7 kV for negative gate pulses. Hence, the total ESD capability was limited to 1.7 kV. There is some freedom for choosing the negative breakdown voltage of the ESD protection diode. In general, the ESD capability of an ESD diode cascade gets better when reducing the breakdown voltage of the diode, for example a high voltage transistor containing an ESD diode with (k−2) stripes has an ESD-HBM (Electrostatic Discharge-Human Body Model) capability higher than 3 kV, and a high voltage transistor containing an ESD diode with k stripes has an ESD HBM capability of 2.3 kV. Thus, by providing the embodiment described above, the above restrains can be overcome.

Figure 8A:
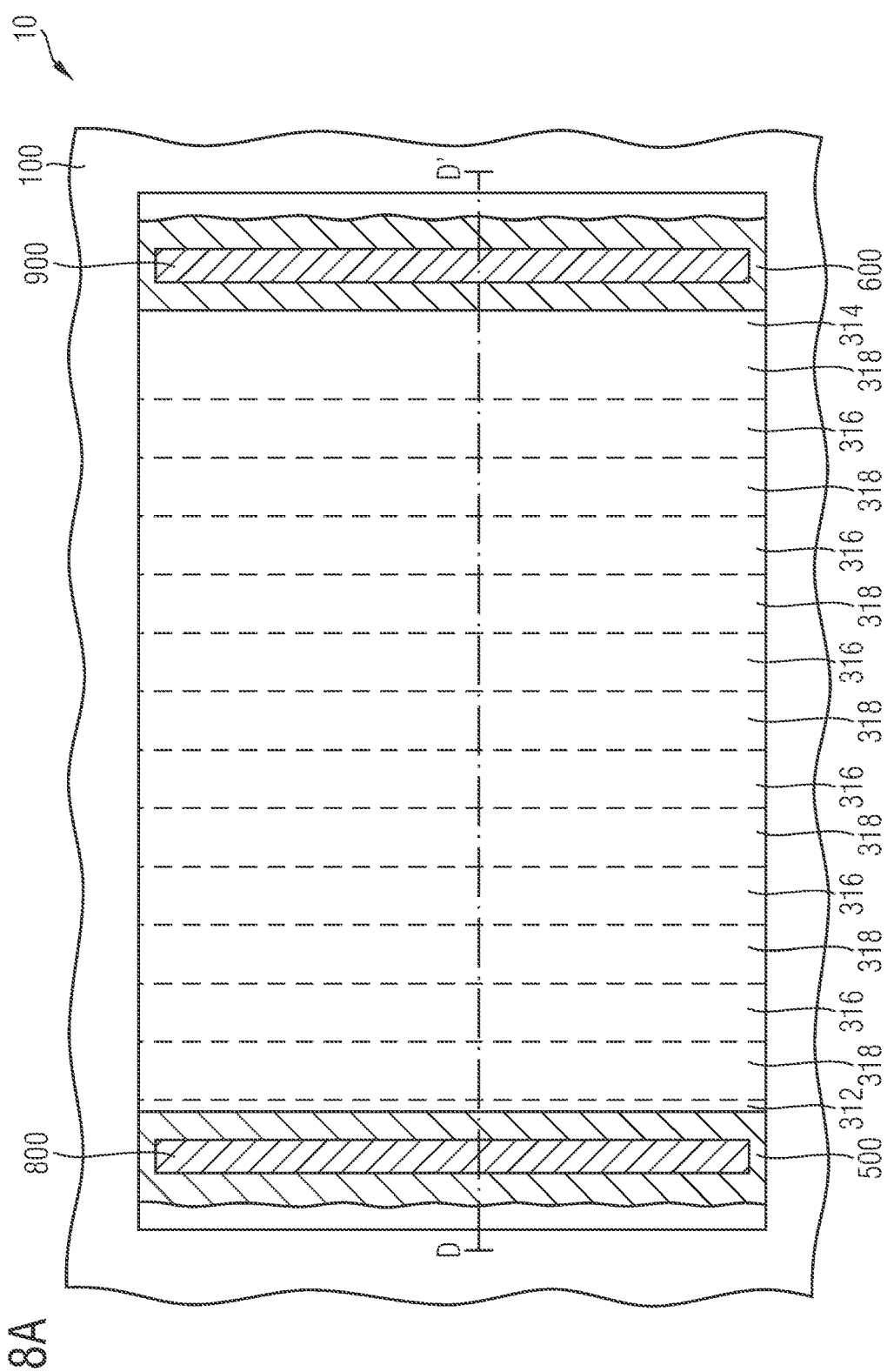
FIG. 8A is a schematic plan view of a portion of a semiconductor device in accordance with another embodiment.
Figure 8B:
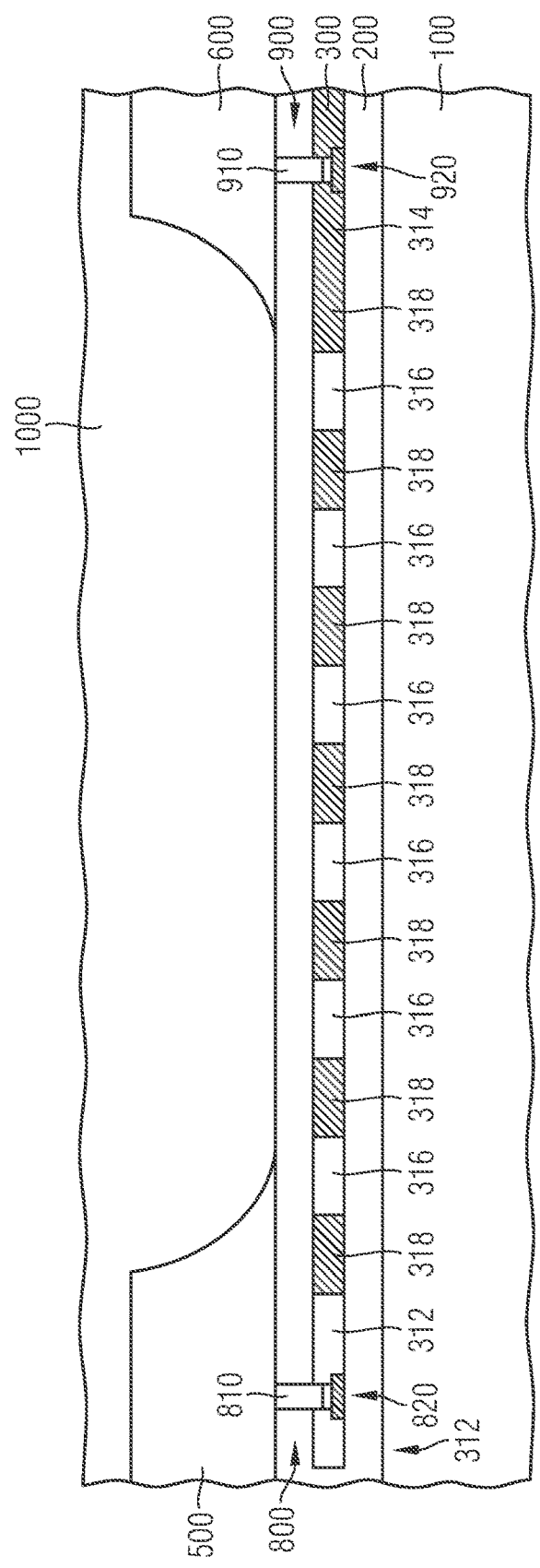
FIG. 8B is a schematic cross-sectional view of a portion of a semiconductor device taken along a section plane D-D' of FIG. 8A.

FIG. 8A is a schematic plan view of a portion of a semiconductor device 10 in accordance with another embodiment, and FIG. 8B is a schematic cross-sectional view of a portion of a semiconductor device 10 taken along a second plane D-D' of FIG. 8A.

Figure 9:
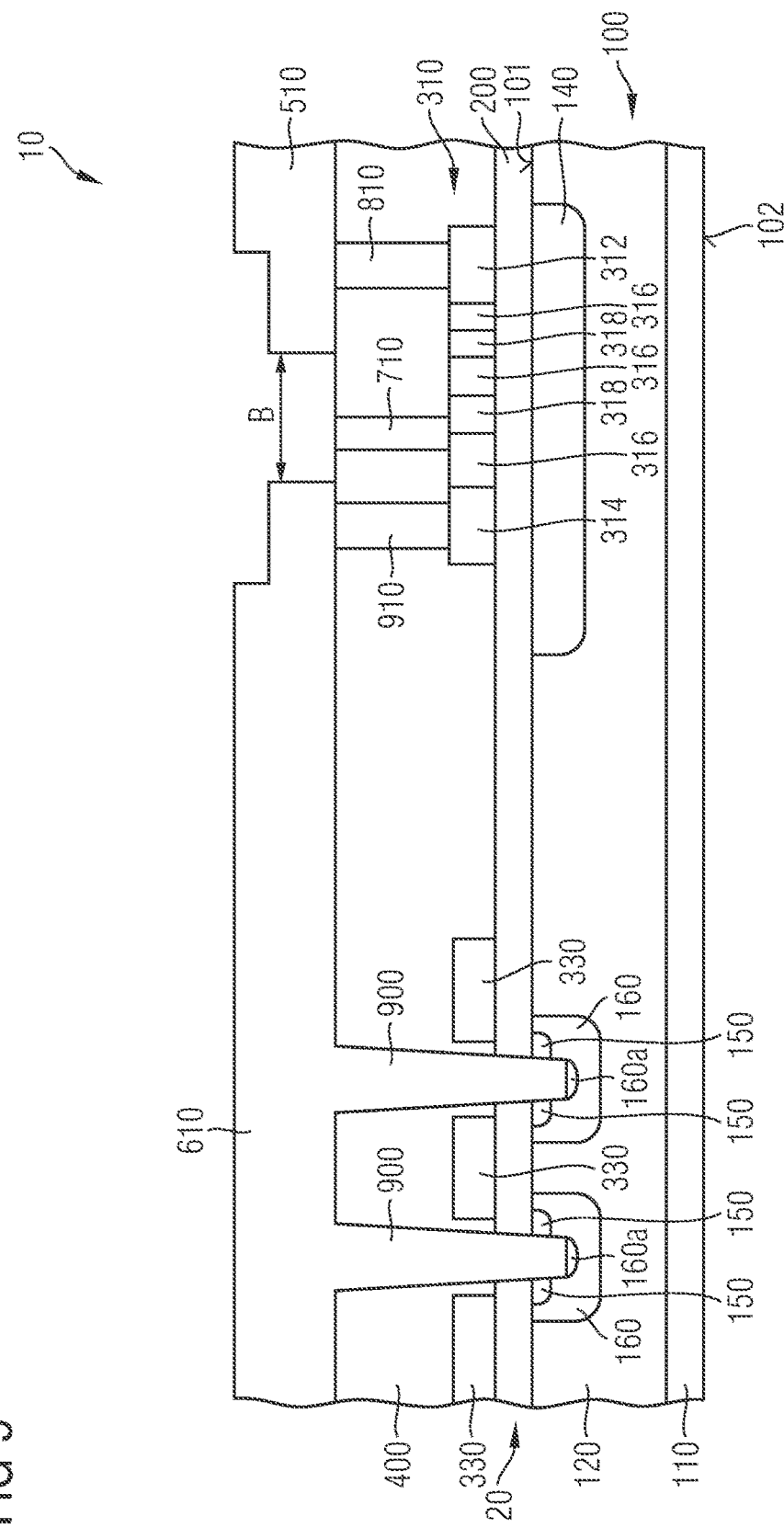
FIG. 9 is a schematic cross-sectional view of a portion of a semiconductor device taken along a section plane A'-A of FIG. 2A or FIG. 2B in accordance with an embodiment.

As can be seen from FIGS. 8A and 8B, the shunting structure 700 of FIGS. 7A and 7B has been omitted, wherein a bidirectional unsymmetrical electrostatic discharge structure with k pn-blocking junctions for positive gate-to-source voltage and only e.g. (k−1) pn-blocking junctions for negative gate-to-source voltage is provided by the specific structure of the second contact structure 900 comprising the second contact element 910 and the terminal shunting structure 920. Herein, the terminal shunting structure 920 electrically shunts a pn-junction between the second terminal region 314 of a second conductivity type and the second contact element 910 of the first conductivity type. For a transistor device, the electrostatic discharge (ESD) diode breakdown voltage may thus be set to about VDB=k*VDB0 (=k pn junctions with VDB0 each). The negative electrostatic discharge (ESD) diode breakdown voltage is set to about (k−1)*VDB0 (=(k−1) pn junctions with VDB0 each). Concretely, this means, that two pn junctions of the monolithically integrated polysilicon Zener diode cascade with 2*k pn-junctions are designed with complementary contacting zones or terminals. FIG. 9 is a schematic cross-sectional view of a portion of a semiconductor device 10 taken along a section plane A'-A of FIG. 2A or FIG. 2B in accordance with an embodiment A can be seen from FIG. 9, the first isolation layer 200 may be a gate dielectric. The first isolation layer 200 may thus comprise one of a gate dielectric and a field dielectric, the first isolation layer 200 may have a thickness in a vertical direction z in a range of 5 nm to 3000 nm. The electrostatic discharge protection structure 310 may be formed on the first isolation layer 200, which leads to reduced thermal transient impedance due to the enhanced thermal coupling between the electrostatic discharge protection structure 310 and the semiconductor body 100. The gate dielectric may be a silicon oxide having a thickness in a range of 5 nm to 200 nm, or in a range of 40 nm to 120 nm. The semiconductor device 10 further comprises transistor cells 20 arranged in an overlap area between the source contact structure 610 and the semiconductor body 100. Each of the transistor cells 20 comprise a gate electrode 330 formed on the first isolation layer 200, source zones 150 being in contact with the first surface 101 of the semiconductor body 100 and extending into the semiconductor body 100, and body zones 160, in which the source zones 150 are embedded. The source zones 150 are of the first conductivity type and the body zones 160 are of the second conductivity type. Furthermore, the drain region 110 of the first conductivity type is provided at the second surface 102 of the semiconductor body 100. The drift region 120 is formed between the drain region 110 and the body zones 160 and is of a first conductivity type. In case of a superjunction device, columns or bubbles of the first conductivity type and the second conductivity type can be implemented both beneath the semiconductor well region 140 and the active transistor cell field. Furthermore, columns or bubbles of the second conductivity type can be overlapping with the semiconductor well region 140. The well region 140 is of a second conductivity type and is used as an electrical shield. Furthermore, body contact zones 160a are provided to provide an electrical contact between the second contact structure 900 connected to the source contact structure 610 and the respective body zones 160. The body contact zones 160a are formed by an ion implantation process of dopants of a second conductivity type, for example, as will be discussed in all detail below.

According to an embodiment, the gate electrode 330 is formed simultaneously with the electrostatic discharge protection structure 310, and may be part of the polysilicon layer 300. The second contact structure 900 is provided to electrically connect the source contact structure 610 with the second terminal region 314 of the electrostatic discharge protection structure 310. The second contact structure 900 may be further provided to connect the source contact structure 610 with the source zones 150 of the transistor cells 20. Thus, the first electrode 500 may comprise a gate contact structure 510 and the second electrode 600 may comprise a source contact structure 610 of transistor cells 20.

Although no multilayer metallization structure is shown, the electrostatic discharge protection structure 310 as described above may be used in discrete semiconductor devices or integrated circuits with multilayer wiring systems, when using polysilicon plugs.

Figure 10:
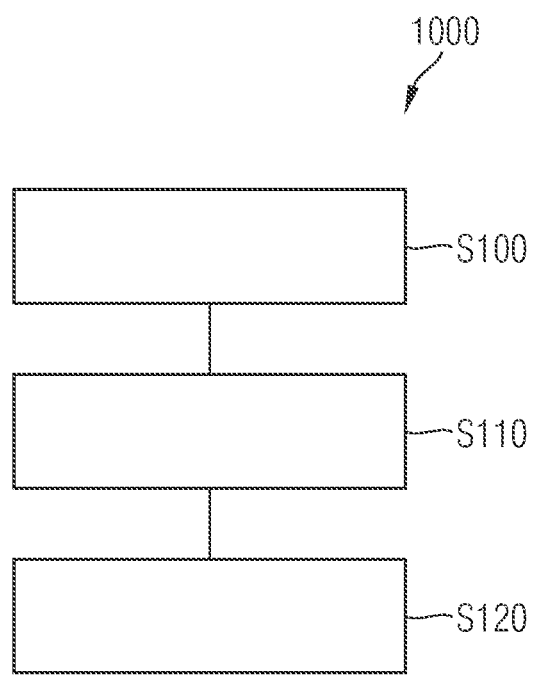
FIG. 10 illustrates a schematic process chart of a method of manufacturing a semiconductor device in accordance with an embodiment.

FIG. 10 is a schematic flow diagram for illustrating a method 1000 of manufacturing a semiconductor device 10.

It will be appreciated that while method 1000 is illustrated and described below as a series of acts or events, the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects of embodiments of the disclosure herein. Also, one or more of the acts depicted therein may be carried out in one or more separate act and/or faces.

A schematic flow diagram for illustrating a method 1000 of manufacturing a semiconductor device is depicted in FIG. 10.

Process feature S100 comprises providing a semiconductor body having a first surface and a second surface opposite to the first surface.

Process feature S110 comprises forming a first isolation layer over the first surface of the semiconductor body.

Process feature S120 comprises forming an electrostatic discharge protection structure over the first isolation layer, the electrostatic discharge protection structure having a first terminal region of a first conductivity type and a second terminal region of a second conductivity type opposite to the first conductivity type.

As can be seen from FIGS. 11A to 11J, a method of manufacturing the semiconductor device 10 according to an embodiment will be described with reference to cross-sectional views for illustration of selected processes.

Figure 11A:
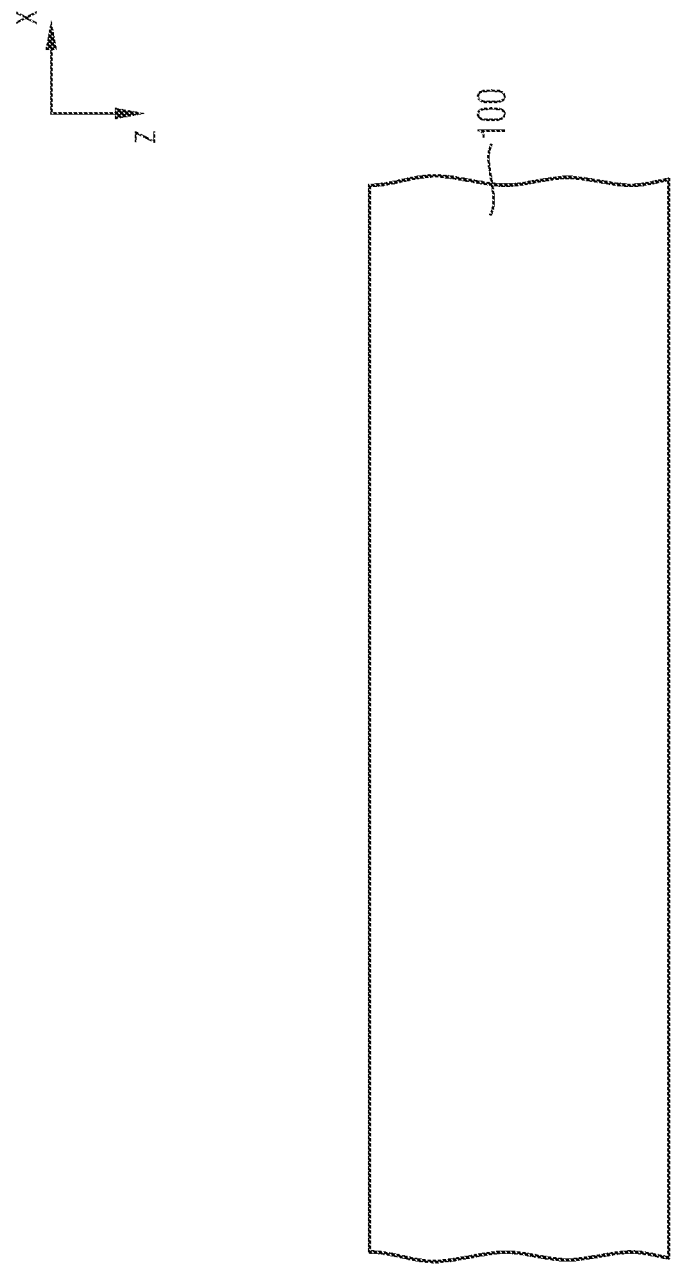
FIGS. 11A to 11J are cross-sectional views illustrating a method of manufacturing a semiconductor device in accordance with an embodiment.

In FIG. 11A, a semiconductor body 100, as described above, is provided.

Figure 11B:
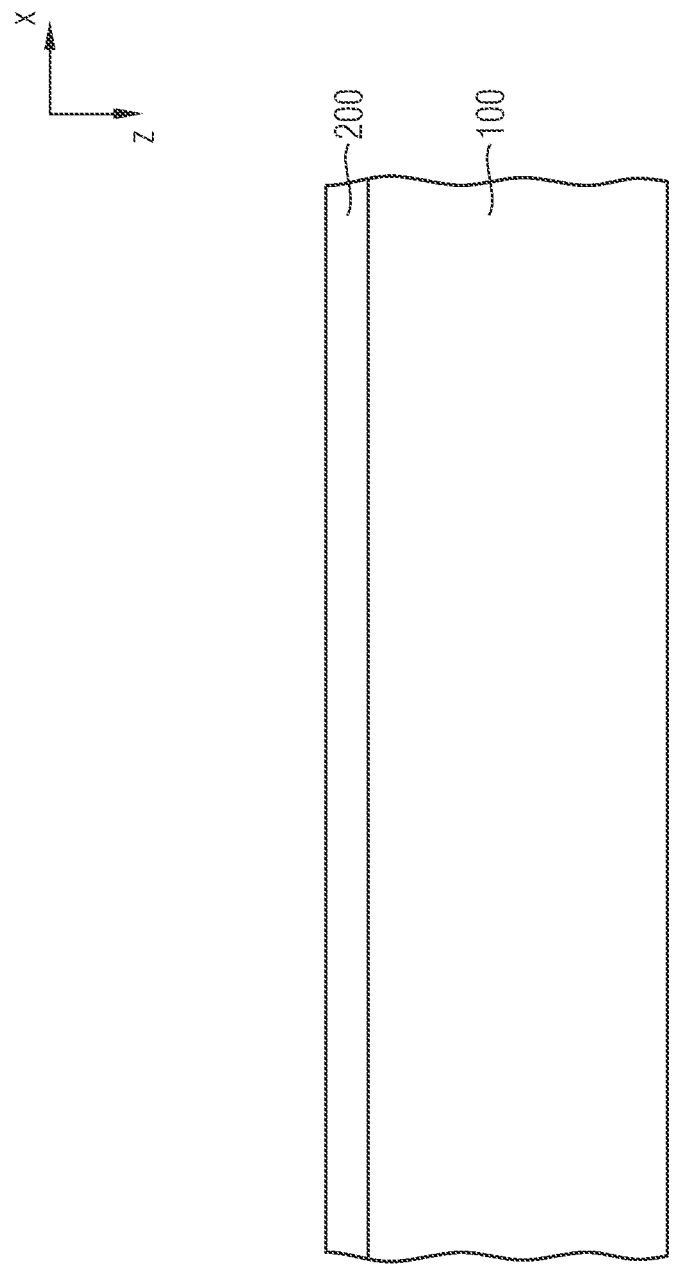

As shown in FIG. 11B, the first isolation layer 200 such as a silicon oxide layer is formed on the semiconductor body 100. The oxide layer of the first isolation layer 200 may be formed by a field oxidation or deposition process or may be formed as a gate oxide layer. The oxide layer of the first isolation layer 200 may be also a local oxidation of silicon (LOCOS) or a shallow trench isolation (STI).

Figure 11C:
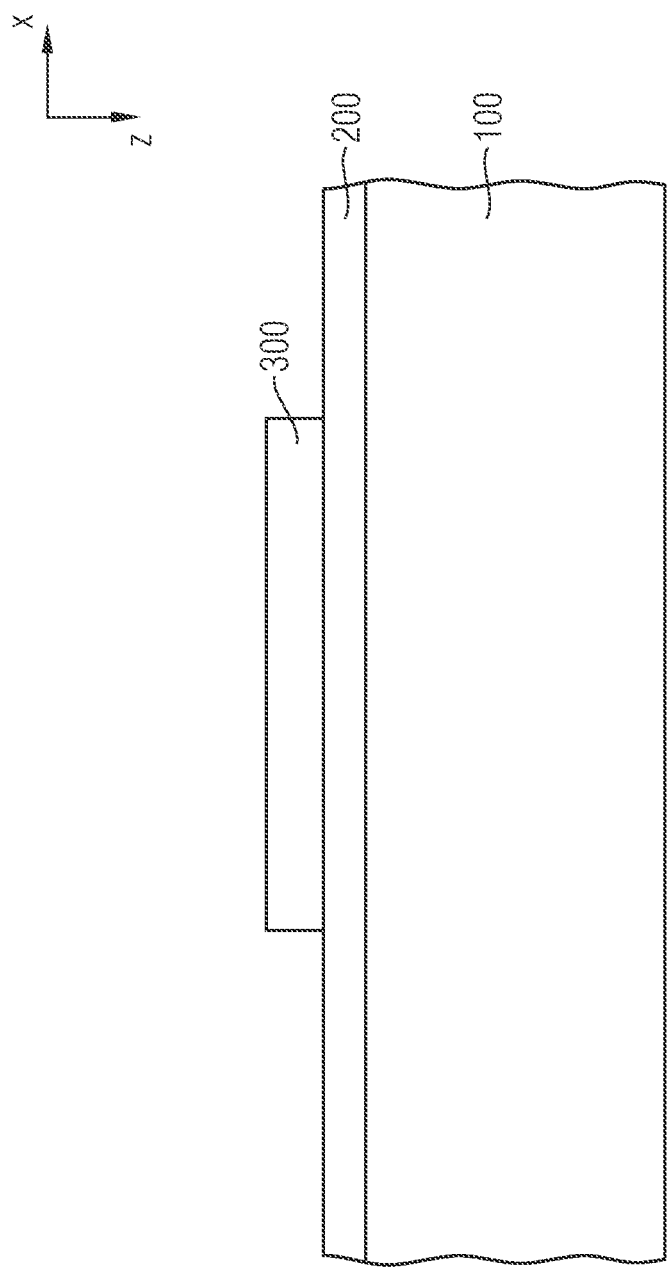

As shown in FIG. 11C, a polysilicon layer 300 of a first conductivity type is formed on the first isolation layer 200. The polysilicon layer 300 may be patterned to have a structure within the lateral plane as shown in FIG. 2A or FIG. 2B (cf. the structures in FIGS. 2A and 2B defined by the dashed lines). The thickness of the polysilicon layer 300 in a vertical direction z may be in a range of 100 nm to 1000 nm, or 200 nm to 600 nm, or 200 nm to 500 nm. The thickness of the polysilicon layer 300 may be limited by the penetration depth of the dopants of the first conductivity type in an ion implantation and diffusion process.

Figure 11D:
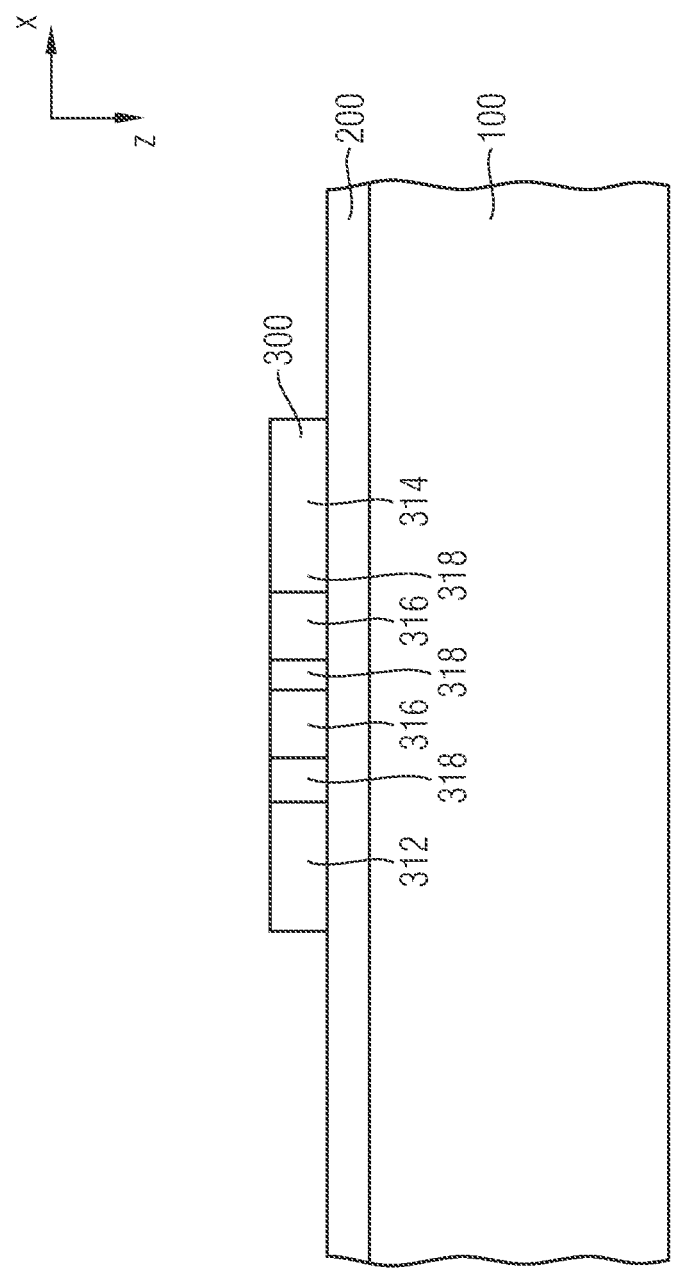

As shown in FIG. 11D, the electrostatic discharge protection structure 310 may be formed on the first isolation layer 200 by an implantation process, to form first regions 316 and second regions 318, as described above.

Figure 11E:
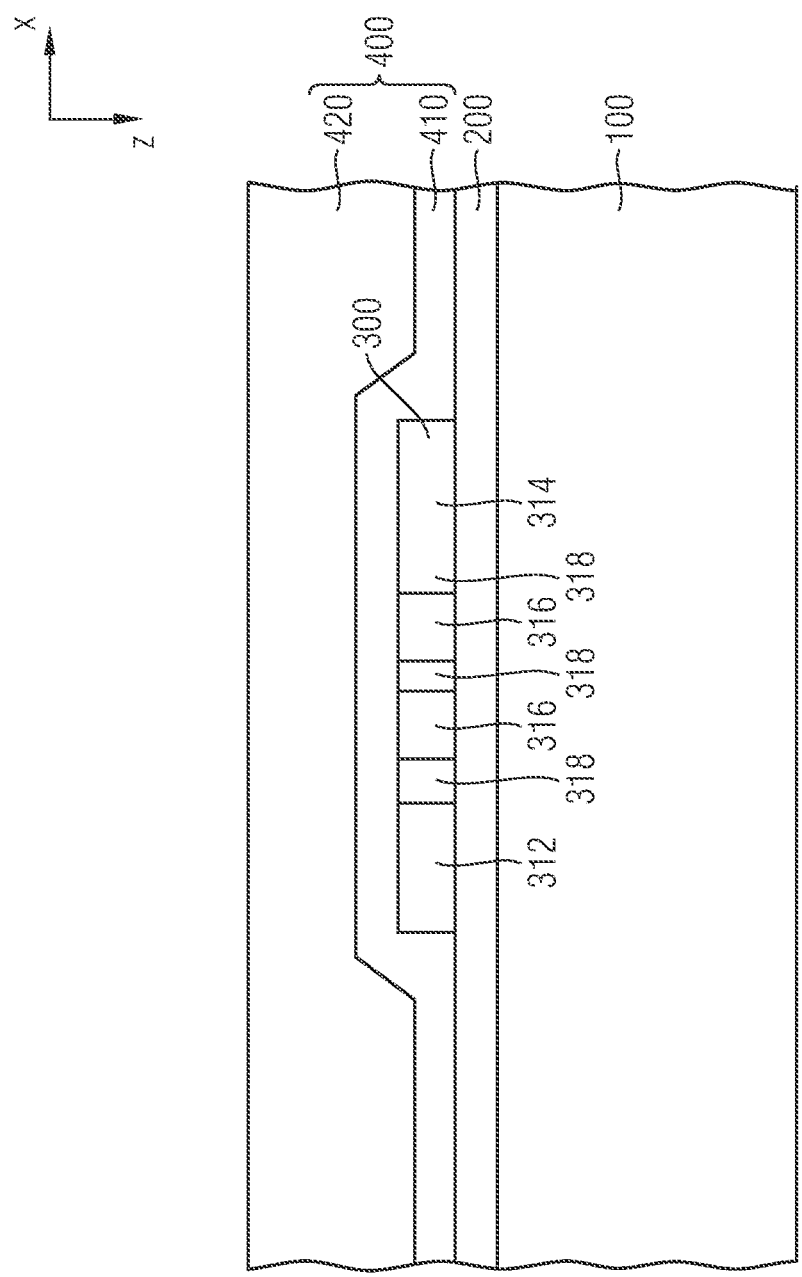

As can be seen from FIG. 11E, the second isolation layer 400 is formed on the polysilicon layer 300. As discussed above, the second isolation layer 400 may comprise a first dielectric layer 410 and a second dielectric layer 420, wherein the first dielectric layer 410 may comprise an USG layer having a thickness in a vertical direction z in a range between 50 nm to 500 nm, or 200 nm to 400 nm. The second dielectric layer 420 may comprise a BPSG-layer having a thickness in a range of 200 nm to 2000 nm, or 1100 nm to 1300 nm. The first and second dielectric layer 410 and 420 may further comprise the materials or have a structure as discussed above.

Figure 11F:
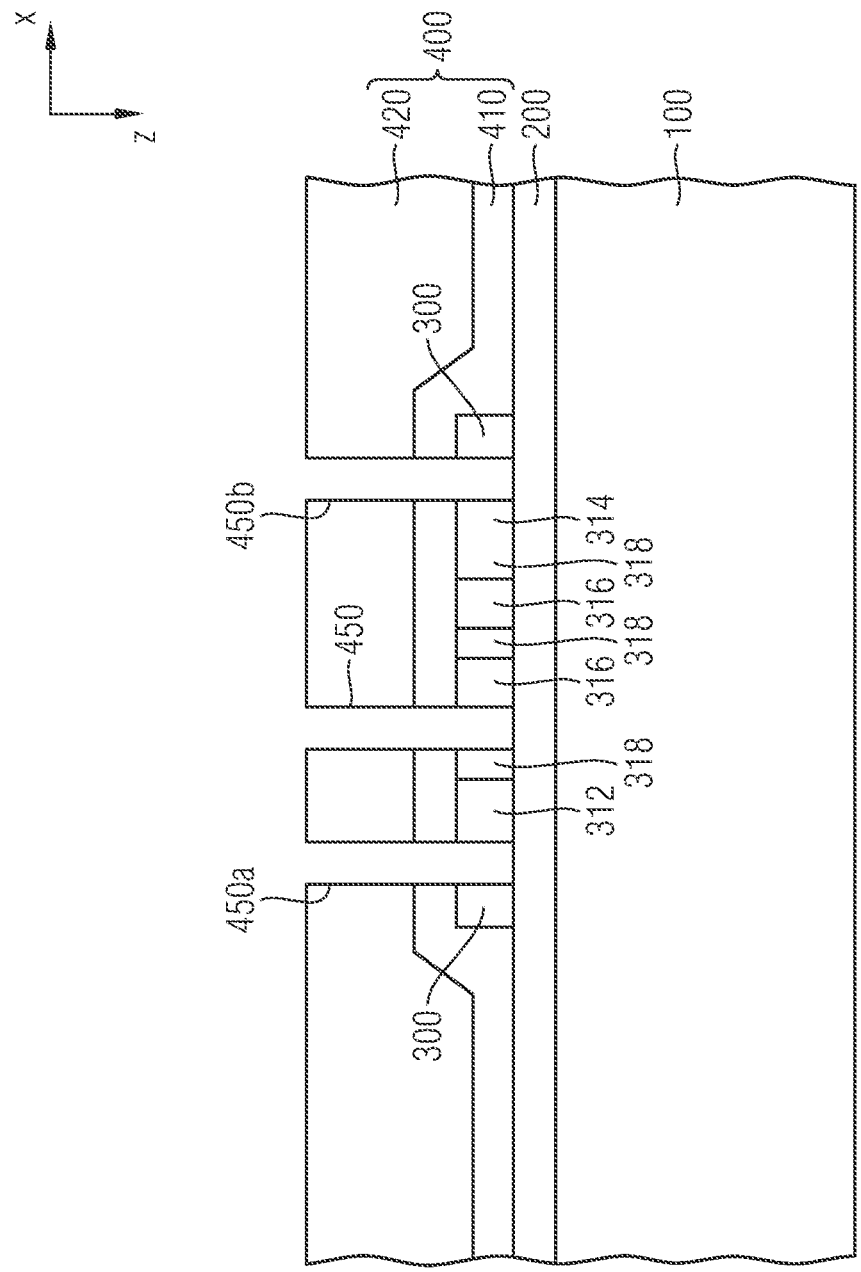
Figure 11G:
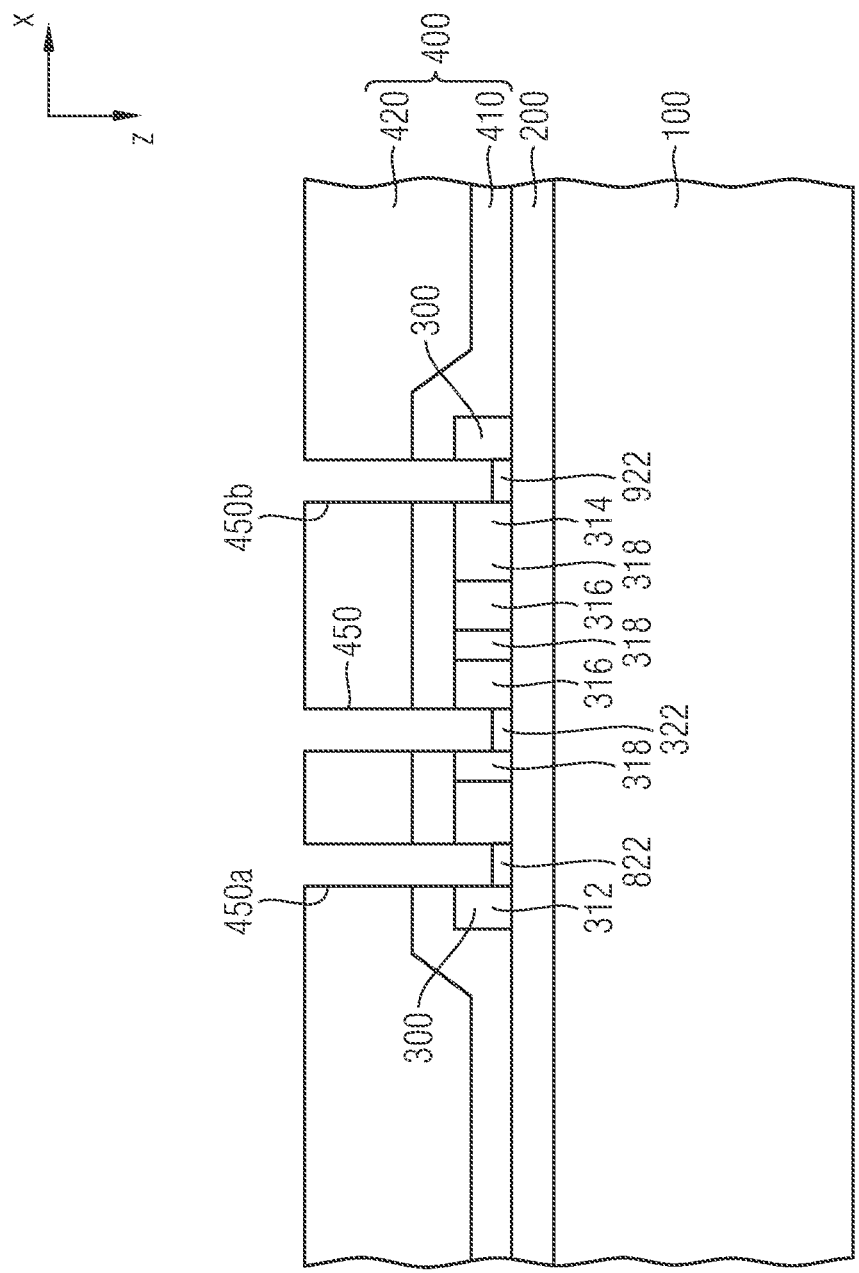

In FIG. 11F, a trench 450 penetrating the second isolation layer 400 and the polysilicon layer 300 is formed. The trench 450 may extend up to a distance of 300 nm into the polysilicon layer 300. The trench 450 may fully penetrate the polysilicon layer 300 to reach to the first isolation layer 200, as can be seen from FIG. 11F. However, the trench 450 may also not fully extend to the first isolation layer 200 but reach only to the upper surface of a remaining polysilicon layer 300, which forms the first polysilicon layer 322 after an implantation of dopants of a second conductivity type, as shown in FIG. 11G. The trench 450 may be formed at the same time together with the trenches 450a and 450b to be filled with the first contact structure 800 and the second contact structure 900, respectively.

As can be seen from FIG. 11G, the first polysilicon layer 322 is formed in the trench 450. At the same, a first polysilicon layer 822 and 922 may be formed in the trenches 450a and 450b, respectively. The first polysilicon layers 322, 822 and 922 may be either formed by depositing undoped polysilicon or polysilicon having an intrinsic net dopant concentration, or may be formed by forming trenches 450, 450a and 450b not fully reaching to the first isolation layer 200, wherein the respective first polysilicon layers 322, 822 and 922 remain. The remaining first polysilicon layers 322, 822 and 922 may then be treated by ion implantation to increase the net dopant concentration of the respective first polysilicon layers 322, 822 and 922. As discussed above, a high net dopant concentration of the first polysilicon layers 322, 822 and 922 prevents forming of a Schottky contact to a metal silicide layer 324 to be formed on the first polysilicon layers 322, 822 and 922. Thus, the net dopant concentration of the first polysilicon layer 322, 822 and 922 may be higher than $1 \times 10^{19}$ cm$^{-3}$. According to the embodiment of FIG. 9, the implantation of ions of a second conductivity type to form the first polysilicon layers 322, 822 and 922 may be performed simultaneously with the implantation of ions of a second conductivity type to form the body contact zones 160a in the same process.

Figure 11H:
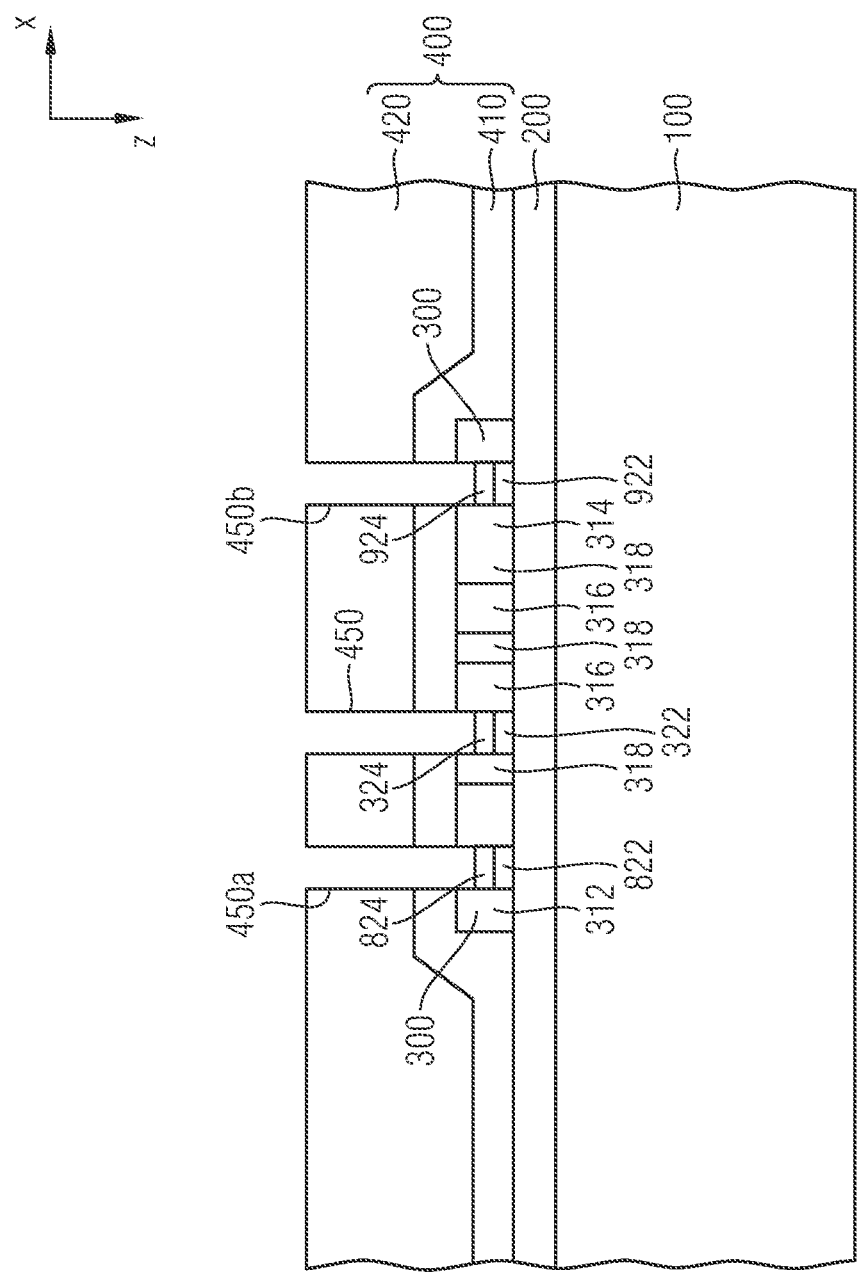
Figure 11:
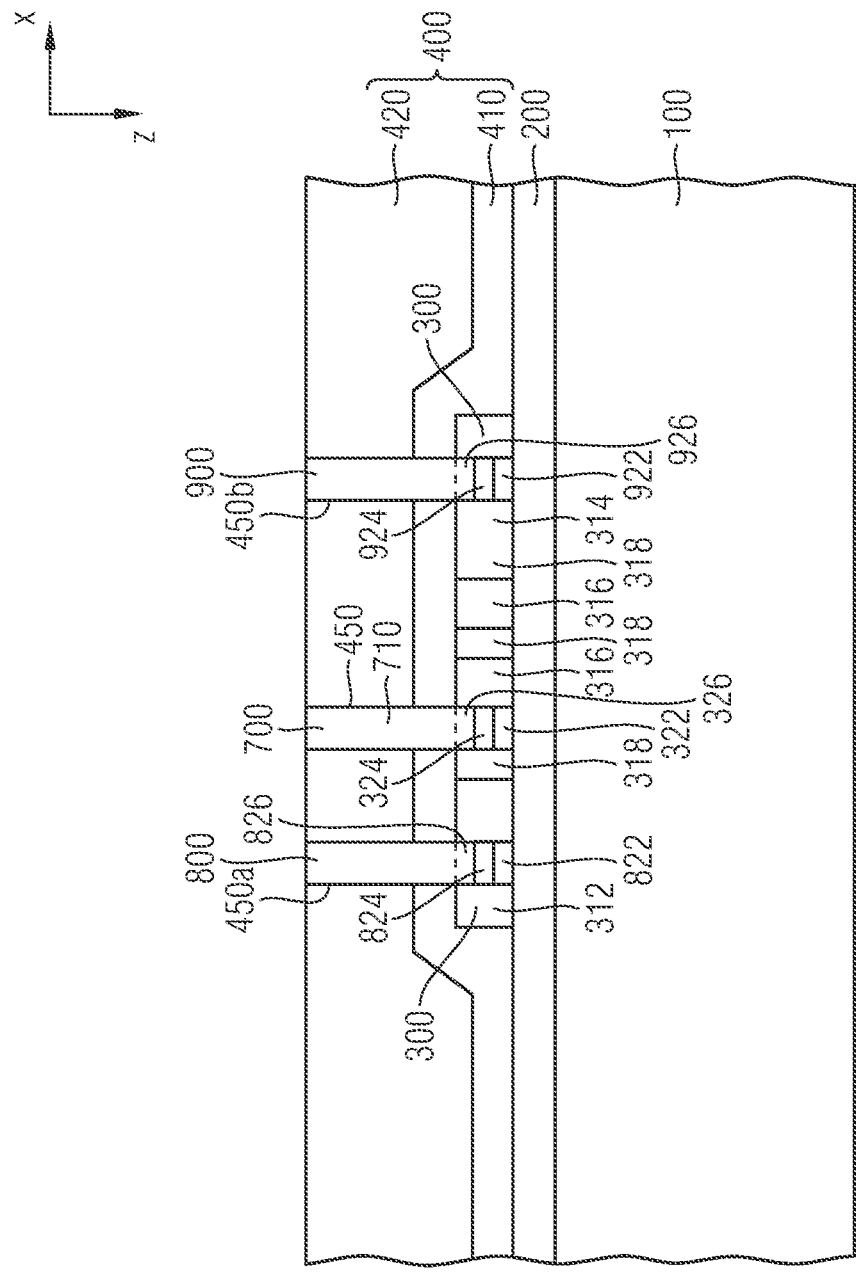

As can be seen from FIG. 11H, a metal silicide layer 324, 824, and 924 is deposited on the first polysilicon layer 322, 822, and 922 of a first conductivity type in the trenches 450, 450a and 450b, respectively.

As can be seen from FIG. 11I, the trenches 450, 450a and 450b are filled with a polysilicon layer of a first conductivity type, thus forming the second polysilicon layers 326, 826 and 926 together with a shunting element 710, the first contact element 810, and the second contact element 910, respectively. The net dopant concentration of the second polysilicon layer 326, 826, and 926 may be higher than $1 \times 10^{19}$ cm$^{-3}$. The net dopant concentration of the shunting element 710, the first contact element 810, and the second contact element 910 may be higher than $1 \times 10^{19}$ cm$^{-3}$. Although the first contact structure 800, the second contact structure 900 and the shunting structure 700 have been described to be formed simultaneously and having the same structure, the shunting structure 700 may be also omitted, as can be seen from FIGS. 8A and 8B. It is also possible that only the second contact structure 900 is formed in a way as described above.

Figure 11J:
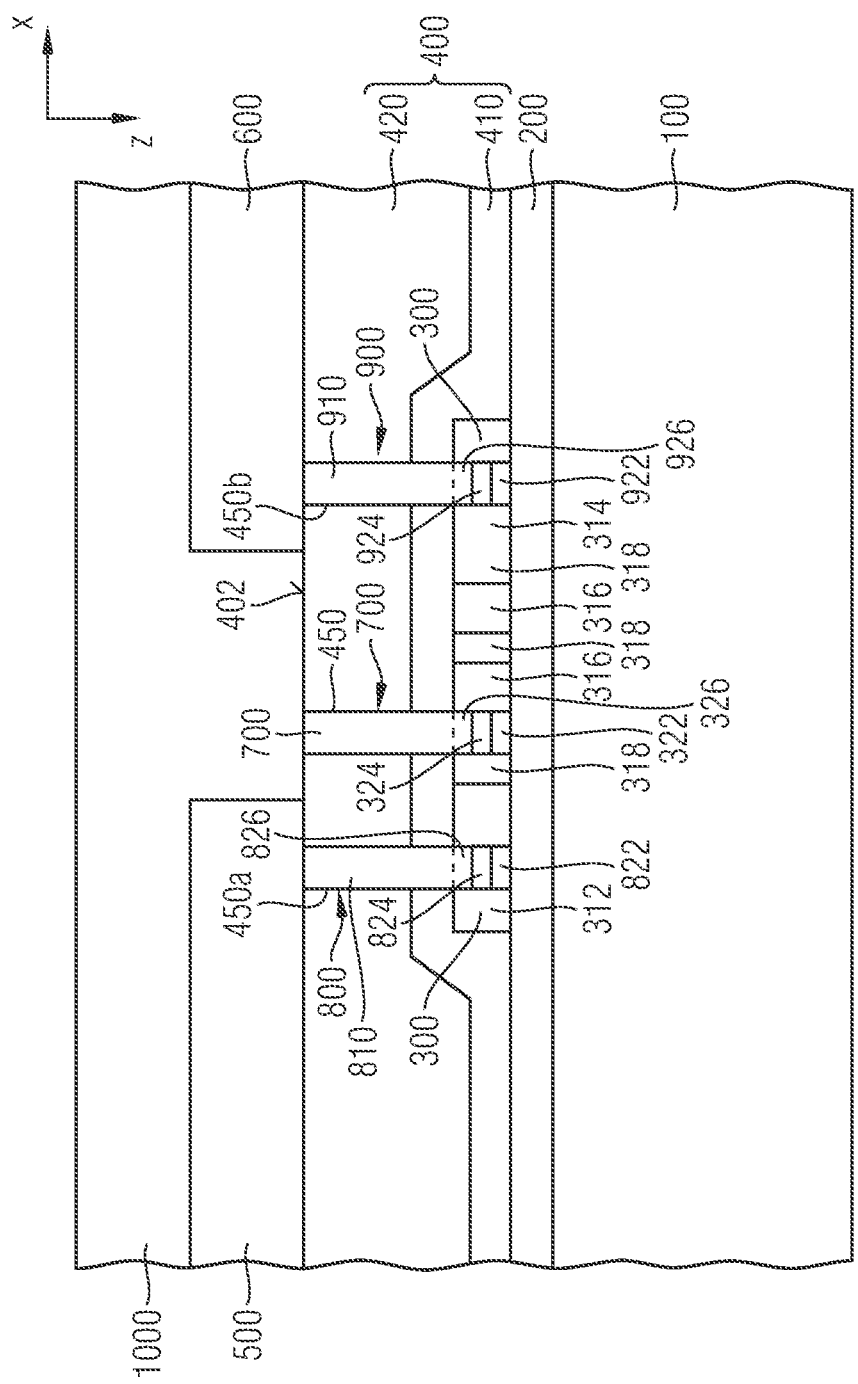

As can be seen from FIG. 11J, after filling the trenches 450, 450a and 450b, the filling material such as polysilicon of the trenches 450, 450a and 450b may be removed by a planarization process, e.g. by a chemical mechanical polishing (CMP) process. By this process, a planarized top surface 402 of the second isolation layer 400 may be formed, with first and second contact structures 800, 900 and the shunting structure 700. The second end 702 of the shunting structure 700 may be in direct contact with the passivation layer 1000 covering the first electrode 500, the second isolation layer 400 and the second electrode 600.

As can be seen form the above description of the manufacturing method and the respective embodiments the first contact element 810 and the second contact element 910 may be of a same conductivity type. Further, the first terminal region 312 and the second terminal region 314 may be of opposite conductivity types. The first electrode 500 may comprise a gate contact structure 510 and the second electrode 600 may comprise a source contact structure 610 of transistor cells 20. The gate contact structure 510 and the source contact structure 610 comprise a metal layer having an extension along the vertical direction z of at least 3 µm. The electrostatic discharge protection structure 310 may comprise a polysilicon layer 300. The first contact element 810 and the second contact element 910 may comprise polysilicon. The terminal shunting structure 920 may comprise polysilicon having a net dopant concentration higher than $1 \times 10^{19}$ cm$^{-3}$. The terminal shunting structure 920 may comprises a metal. The terminal shunting structure 920 may comprise a vertically stacked layer structure of a first polysilicon layer 922 and a second polysilicon layer 926 of different conductivity type. The terminal shunting structure 920 may further comprise a metal silicide layer 924 being interposed between the first and second polysilicon layers 922, 926.

As described above, an unsymmetrical electrostatic discharge protection structure is provided to meet an increased ESD-HBM (electrostatic discharge-human body model) capability for power metal oxide semiconductor devices. The ESD diode breakdown voltage may be set to about k*VDB0, which is achieved by providing k pn-junctions with a breakdown voltage of VDB0 each. Therefore, the negative ESD diode breakdown voltage may be set to about (k−1) to (k−3)*VDB0, which is achieved by providing (k−1) to (k−3) pn-junctions with a breakdown voltage of VDB0 each. According to the embodiment of FIGS. 8A and 8B, the negative ESD diode breakdown voltage may be set to about (k−1)*VDB0, which is achieved by providing (k−1) pn-junctions with a breakdown voltage of VDB0 each. Thus, since one or two pn-junctions of the monolithically integrated polysilicon Zener diode cascade with 2*k pn-junctions in sum are electrically shortened by introduction of electron-hole-converters, the unsymmetrical ESD protection behavior can be achieved. By means of this, the ESD windows will be enlarged significantly for negative pulses on the gate pin.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a semiconductor body having a first surface and a second surface opposite to the first surface;
a first isolation layer over the first surface of the semiconductor body;
an electrostatic discharge protection structure over the first isolation layer, the electrostatic discharge protection structure having a first terminal region of a first conductivity type and a second terminal region of a second conductivity type opposite to the first conductivity type;
a second isolation layer over the electrostatic discharge protection structure;
a first electrode and a second electrode over the second isolation layer, the first electrode being electrically coupled to the first terminal region via a first contact element and the second electrode being electrically coupled to the second terminal region via a second contact element; and
a terminal shunting structure electrically shunting a junction between the second terminal region and the second contact element,
wherein the second contact element is of a first conductivity type and the terminal shunting structure electrically shunts a pn-junction between the second terminal region and the second contact element.

2. The semiconductor device of claim 1, wherein the first electrode comprises a gate contact structure and the second electrode comprises a source contact structure of transistor cells.

3. The semiconductor device of claim 1, wherein the electrostatic discharge protection structure comprises a polysilicon layer.

4. The semiconductor device of claim 1, wherein the first contact element and the second contact element comprise polysilicon.

5. The semiconductor device of claim 1, wherein the terminal shunting structure comprises polysilicon having a net dopant concentration higher than $1 \times 10^{19}$ cm$^{-3}$.

6. The semiconductor device of claim 1, wherein the terminal shunting structure comprises a metal.

7. The semiconductor device of claim 1, wherein the first and the second terminal regions are electrically interconnected by first regions and second regions of opposite conductivity types alternatingly arranged along a lateral direction.

8. The semiconductor device of claim 7, wherein the electrostatic discharge protection structure comprises at least 2 first regions and at least 2 second regions.

9. The semiconductor device of claim 1, wherein the first isolation layer comprises one of a gate dielectric or a field dielectric, and wherein the first isolation layer has a thickness in a vertical direction in a range of 5 nm to 3000 nm.

10. A semiconductor device, comprising:
a semiconductor body having a first surface and a second surface opposite to the first surface;
a first isolation layer over the first surface of the semiconductor body;
an electrostatic discharge protection structure over the first isolation layer, the electrostatic discharge protection structure having a first terminal region of a first conductivity type and a second terminal region of a second conductivity type opposite to the first conductivity type;
a second isolation layer over the electrostatic discharge protection structure;
a first electrode and a second electrode over the second isolation layer, the first electrode being electrically coupled to the first terminal region via a first contact element and the second electrode being electrically coupled to the second terminal region via a second contact element; and
a terminal shunting structure electrically shunting a junction between the second terminal region and the second contact element,
wherein the terminal shunting structure comprises a vertically stacked layer structure of a first polysilicon layer and a second polysilicon layer of different conductivity types, and a metal silicide layer interposed between the first and the second polysilicon layers.

11. A semiconductor device, comprising:
a semiconductor body having a first surface and a second surface opposite to the first surface;
a first isolation layer over the first surface of the semiconductor body;
an electrostatic discharge protection structure over the first isolation layer, the electrostatic discharge protection structure having a first terminal region of a first conductivity type and a second terminal region of a second conductivity type opposite to the first conductivity type, the first and the second terminal regions being electrically interconnected by first regions and second regions of opposite conductivity types alternatingly arranged along a lateral direction; and
a shunting structure electrically shunting a pn-junction between one of the first regions and one of the second regions of the electrostatic discharge protection structure.

12. The semiconductor device of claim 11, wherein the electrostatic discharge protection structure comprises at least 2 first regions and at least 2 second regions.

13. The semiconductor device of claim 11, wherein the shunting structure comprises an intermediate region that extends into the electrostatic discharge protection structure along a vertical direction.

14. The semiconductor device of claim 13, wherein the intermediate region is interposed between one of the first regions and one of the second regions along the lateral direction.

15. The semiconductor device of claim 13, wherein the intermediate region comprises a same structure as the terminal shunting structure.

16. The semiconductor device of claim 11, wherein a ratio of a thickness of the shunting structure along a vertical direction and a thickness of the electrostatic discharge protection structure along a vertical direction is greater than 1.

* * * * *